(12) United States Patent
Kudo et al.

(10) Patent No.: US 11,342,167 B2
(45) Date of Patent: May 24, 2022

(54) PLASMA PROCESSING METHOD INCLUDING CLEANING OF INSIDE OF CHAMBER MAIN BODY OF PLASMA PROCESSING APPARATUS

(71) Applicant: Tokyo Electron Limited, Tokyo (JP)

(72) Inventors: Jin Kudo, Miyagi (JP); Taku Gohira, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/910,240

(22) Filed: Jun. 24, 2020

(65) Prior Publication Data
US 2020/0321200 A1 Oct. 8, 2020

Related U.S. Application Data

(63) Continuation of application No. 15/876,319, filed on Jan. 22, 2018, now Pat. No. 10,714,320.

(30) Foreign Application Priority Data

Jan. 24, 2017 (JP) .............................. JP2017-010538

(51) Int. Cl.
*H01J 37/32* (2006.01)
*H01L 21/3065* (2006.01)
(Continued)

(52) U.S. Cl.
CPC .. *H01J 37/32862* (2013.01); *H01J 37/32642* (2013.01); *H01J 37/32724* (2013.01); *H01L 21/3065* (2013.01); *H01L 21/31116* (2013.01); *H01L 21/67092* (2013.01); *H01L 21/67098* (2013.01); *H01L 21/6831* (2013.01); *H01L 21/68735* (2013.01); *H01L 21/68785* (2013.01)

(58) Field of Classification Search
None
See application file for complete search history.

(56) References Cited

U.S. PATENT DOCUMENTS 5,911,833 A 6/1999 Denison et al.
6,063,710 A 5/2000 Kadomura et al.
(Continued)

FOREIGN PATENT DOCUMENTS

CN 104900483 A 9/2015
JP H05-136095 A 6/1993
(Continued)

*Primary Examiner* — Allan W. Olsen
(74) *Attorney, Agent, or Firm* — Pearne & Gordon LLP

(57) ABSTRACT

A time period for cleaning performed to remove a deposit formed within a chamber main body can be reduced. A plasma processing method including the cleaning of an inside of the chamber main body of a plasma processing apparatus is provided. The method includes etching including a main etching of etching an etching target film of a processing target object placed on a stage in a low temperature by generating plasma of a processing gas containing a fluorocarbon gas and/or a hydrofluorocarbon gas; carrying-out the processing target object from a chamber; and cleaning the inside of the chamber main body by generating plasma of a cleaning gas in a state that a temperature of an electrostatic chuck is set to be high.

18 Claims, 14 Drawing Sheets

(51) Int. Cl.
    *H01L 21/67*     (2006.01)
    *H01L 21/683*     (2006.01)
    *H01L 21/687*     (2006.01)
    *H01L 21/311*     (2006.01)

(56) References Cited

U.S. PATENT DOCUMENTS

| | | |
|---|---|---|
| 6,095,083 A | 8/2000 | Rice et al. |
| 6,425,953 B1 | 7/2002 | Johnson |
| 8,848,335 B2 | 9/2014 | Hori et al. |
| 2003/0000546 A1 | 1/2003 | Richardson et al. |
| 2013/0267094 A1 | 10/2013 | Katsunuma et al. |
| 2014/0113450 A1 | 4/2014 | Uda et al. |
| 2014/0238609 A1 | 8/2014 | Tomioka et al. |
| 2015/0255259 A1* | 9/2015 | Li .................... H01J 37/32862 134/18 |
| 2016/0099131 A1 | 4/2016 | Kihara et al. |
| 2016/0172212 A1* | 6/2016 | Niitsuma .......... H01J 37/32027 438/716 |
| 2017/0133233 A1 | 5/2017 | Sato et al. |
| 2017/0178922 A1 | 6/2017 | Takashima et al. |
| 2017/0330759 A1* | 11/2017 | Gohira .............. H01L 21/67069 |
| 2017/0358460 A1 | 12/2017 | Tomura et al. |
| 2018/0076048 A1 | 3/2018 | Gohira et al. |

FOREIGN PATENT DOCUMENTS

| | | |
|---|---|---|
| JP | H06-252107 A | 9/1994 |
| JP | H07-122546 A | 5/1995 |
| JP | H10-116822 A | 5/1998 |
| JP | 2007-067455 A | 3/2007 |
| JP | 2016-122774 A | 7/2016 |

* cited by examiner

PLASMA PROCESSING METHOD INCLUDING CLEANING OF INSIDE OF CHAMBER MAIN BODY OF PLASMA PROCESSING APPARATUS

CROSS-REFERENCE TO RELATED APPLICATION

This is a continuation application of U.S. patent application Ser. No. 15/876,319, filed on Jan. 22, 2018, which claims the benefit of Japanese Patent Application No. 2017-010538 filed on Jan. 24, 2017, the entire disclosures of which are incorporated herein by reference.

TECHNICAL FIELD

The embodiments described herein pertain generally to a plasma processing method including cleaning of an inside of a chamber main body of a plasma processing apparatus.

BACKGROUND

In the manufacture of an electronic device such as a semiconductor device, an etching target film of a processing target object is etched by plasma etching. In the plasma etching, the processing target object is placed on an electrostatic chuck of a stage provided within a chamber main body of a plasma processing apparatus. Then, a processing gas is supplied into a chamber, and plasma is generated as the processing gas is excited.

The etching target film to be etched in the plasma etching may be, for example, a silicon oxide film, a silicon nitride film, or a multilayered film composed of these films. In the plasma etching of the etching target film such as the silicon oxide film, the silicon nitride film or the multilayered film of these films, a processing gas containing either or both of a fluorocarbon gas and a hydrofluorocarbon gas is used. For example, described in Patent Document 1 is a technique of etching a silicon oxide film by plasma of a processing gas containing a fluorocarbon gas.

Patent Document 1: Japanese Patent Laid-open Publication No. H10-116822

In the plasma etching of the etching target film such as the silicon oxide film, the silicon nitride film or the multilayered film of these films, if a temperature of the processing target object is low, an etching rate of the etching target film tends to be increased. Accordingly, the plasma etching may be performed in a state that the electrostatic chuck and the processing target object are set to a low temperature. If the plasma etching using the processing gas containing either or both of the fluorocarbon gas and the hydrofluorocarbon gas is performed, a deposit is formed within the chamber main body, e.g., on an inner wall surface of the chamber main body and the stage. Therefore, it is required to clean the inside of the chamber main body prior to performing the plasma etching on an etching target film of another processing target object after the plasma etching on the etching target film of the previous processing target object is finished. It is desirable that a cleaning time is short as a long cleaning time may cause a reduction of a throughput of a plasma processing in the plasma processing apparatus.

SUMMARY

In one exemplary embodiment, there is provided a plasma processing method (hereinafter, simply referred to as "method") including cleaning of an inside of a chamber main body of a plasma processing apparatus. The plasma processing apparatus includes the chamber main body, a stage and a temperature control device. An internal space of the chamber main body is configured as a chamber. The stage is provided within the chamber. The stage is configured to hold a processing target object placed thereon. The temperature control device is configured to adjust a temperature of an electrostatic chuck.

The method includes (i) etching an etching target film of the processing target object placed on the electrostatic chuck by generating plasma of a processing gas containing a fluorocarbon gas and/or a hydrofluorocarbon gas within the chamber (hereinafter, referred to as "etching process"), the etching of the etching target film including a main etching of etching the etching target film in a state that the temperature of the electrostatic chuck is set to be equal to or lower than −30° C. by the temperature control device; (ii) carrying-out the processing target object from the chamber after the etching of the etching target film is performed (hereinafter, referred to as "carrying-out process"); and (iii) cleaning the inside of the chamber main body by generating plasma of a cleaning gas containing oxygen within the chamber in a state that the temperature of the electrostatic chuck is set to be equal to or higher than 0° C. by the temperature control device after the carrying-out of the processing target object is performed (hereinafter, referred to as "cleaning process").

In the etching process of the method according to the exemplary embodiment, a deposit containing carbon and fluorine is formed within the chamber main body. Though this deposit is removed by the cleaning of the inside of the chamber main body with the plasma of the cleaning gas, a removing rate of the deposit is low when the temperature of the electrostatic chuck is low as being equal to or less than −30° C. In this method, since the cleaning process is performed in the state that the temperature of the electrostatic chuck is set to be equal to or higher than 0° C., the removing rate of the deposit is increased. Therefore, according to this method, a time period for the cleaning of the inside of the chamber main body is shortened.

The etching process may further include an overetching of etching the etching target film additionally after the main etching is performed.

The method may further include raising the temperature of the electrostatic chuck by the temperature control device (hereinafter, referred to as "temperature raising process"), in order to raise the temperature of the electrostatic chuck to be equal to or higher than 0° C. before the cleaning process is performed.

In the exemplary embodiment, the temperature raising process is performed when the overetching is being performed. In this exemplary embodiment, since the raising of the temperature of the electrostatic chuck is performed in parallel with the overetching, an additional time period only for raising the temperature of the electrostatic chuck is not necessary. Thus, a time period from an end of the etching process to a start of the cleaning process is shortened.

The temperature of the electrostatic chuck may be set to be higher than −30° C. and lower than 0° C. when the overetching is being performed. If the temperature of the processing target object when the overetching is being performed is higher than the temperature of the processing target object when the main etching is being performed, an etching rate of the etching target film by the overetching is reduced. Accordingly, controllability over an etching amount of the etching target film can be improved. Further, damage on an underlying layer of the etching target film is suppressed.

The method may further include neutralizing the electrostatic chuck after the etching process is performed and before the carrying-out process is performed; and the temperature raising process. The temperature raising process is performed when the neutralizing of the electrostatic chuck is being performed. According to this exemplary embodiment, the raising of the temperature of the electrostatic chuck is performed in parallel with the neutralizing of the electrostatic chuck which is performed in a period between the etching process and the carrying-out process. Accordingly, the time period from the end of the etching process to the start of the cleaning process can be shortened.

The stage may include a lower electrode in which a path is formed. The electrostatic chuck may be provided on the lower electrode. The temperature control device may include a first temperature adjuster configured to supply a first heat exchange medium; and a second temperature adjuster configured to supply a second heat exchange medium having a temperature higher than a temperature of the first heat exchange medium. The first heat exchange medium may be supplied into the path of the lower electrode from the first temperature adjuster when the main etching is being performed, and the second heat exchange medium may be supplied into the path of the lower electrode from the second temperature adjuster when the raising of the temperature of the electrostatic chuck is being performed. According to the present exemplary embodiment, when starting the temperature raising process, it is possible to switch the heat exchange medium supplied into the path of the lower electrode to the heat exchange medium of the high temperature at a high speed.

The stage may include a heater provided in the electrostatic chuck and a cooling table in which a path is formed. The electrostatic chuck may be provided on the cooling table. A sealed space may be provided between the electrostatic chuck and the cooling table. The temperature control device may include the heater of the electrostatic chuck; a chiller unit configured to supply a coolant into the path; and a pipeline system configured to connect one of the chiller unit, a gas exhaust device and a source of a heat transfer gas to the sealed space selectively. The coolant may be supplied into the path of the cooling table from the chiller unit and the coolant is supplied into the sealed space from the chiller unit when the main etching is being performed. The electrostatic chuck may be heated by the heater and the sealed space is decompressed by the gas exhaust device when the temperature raising process is being performed. In this exemplary embodiment, since heat resistance in the space between the electrostatic chuck and the cooling table is increased when the temperature raising process is being performed, heat transfer between the cooling table and the electrostatic chuck is suppressed. Further, the electrostatic chuck is heated by the heater when the temperature raising process is being performed. Accordingly, a time period required to raise the temperature of the electrostatic chuck is shortened.

According to the exemplary embodiments, it is possible to reduce the time period for the cleaning performed to remove the deposit formed within the chamber main body.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
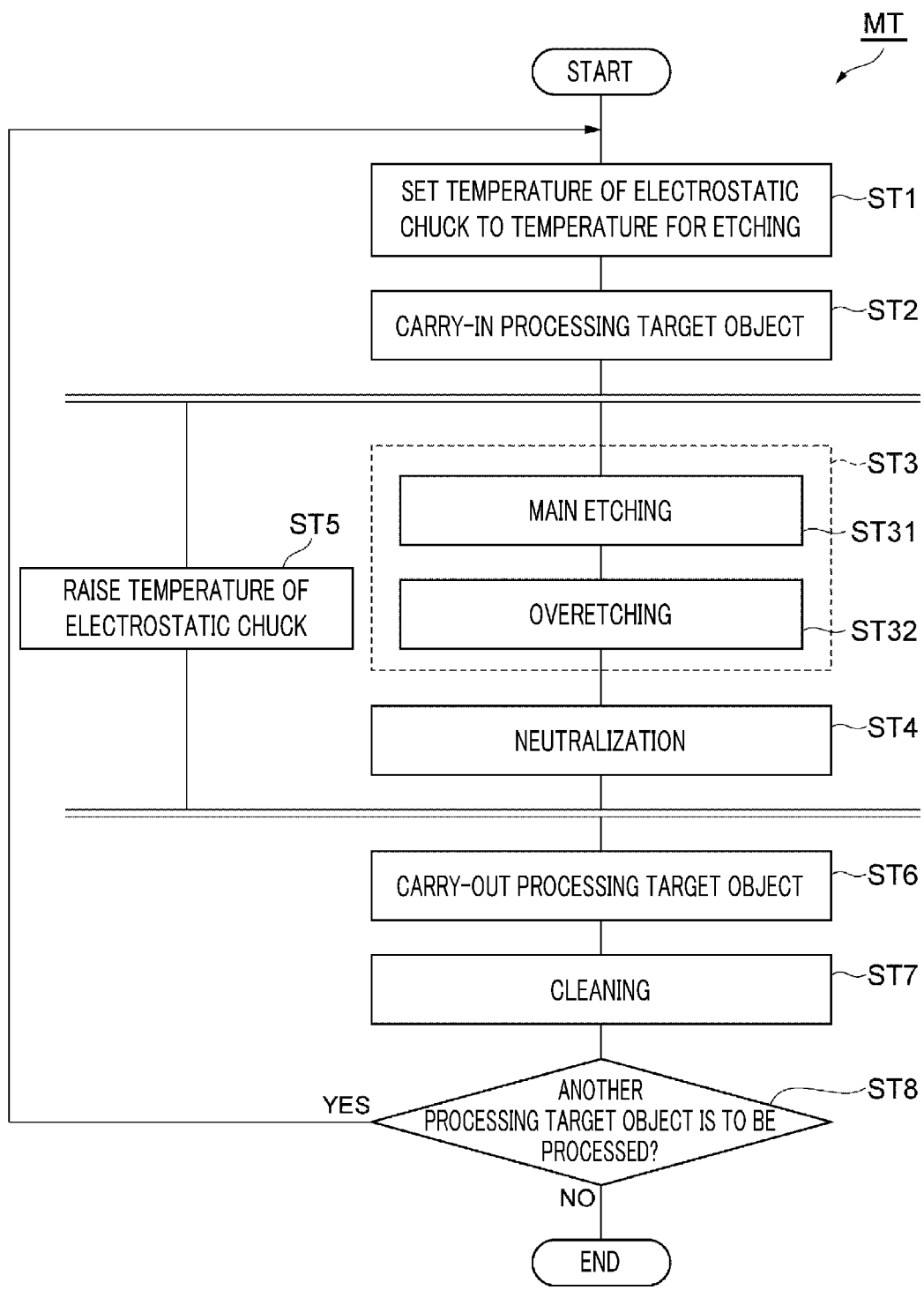
FIG. 1 is a flowchart for describing a plasma processing method according to an exemplary embodiment.
Figure 2:
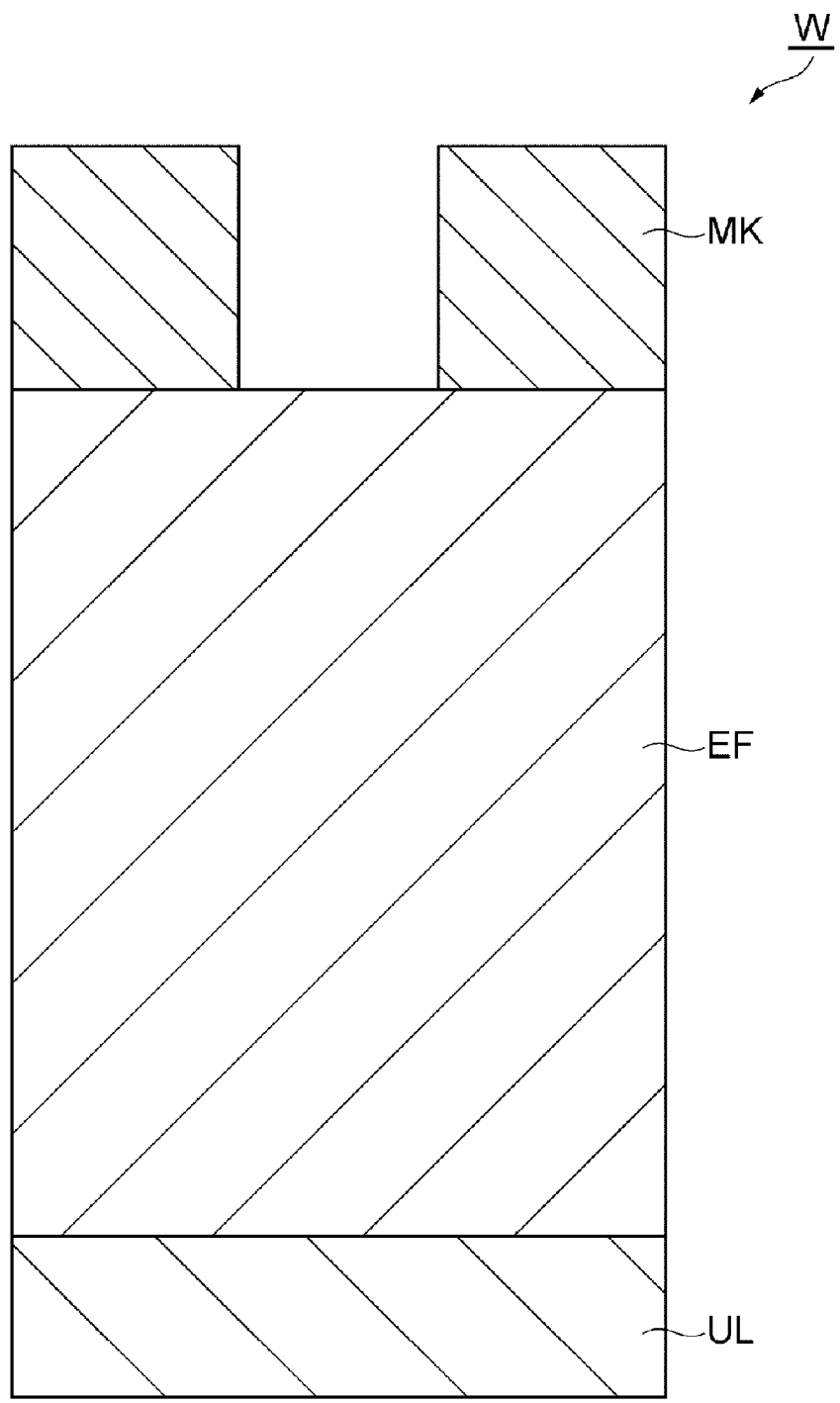
FIG. 2 is a cross sectional view illustrating a part of an example of a processing target object.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein FIG. 1 is a flowchart for describing a plasma processing method according to an exemplary embodiment. A plasma processing method MT (hereinafter, simply referred to as "method MT") shown in FIG. 1 includes etching an etching target film of a processing target object in a plasma processing apparatus and then cleaning an inside of a chamber main body of the plasma processing apparatus. FIG. 2 is a cross sectional view illustrating a part of an example of the processing target object. The method MT is applicable to a processing target object W shown in FIG. 2.

As depicted in FIG. 2, the processing target object W includes an underlying layer UL, an etching target film EF and a mask MK. The underlying layer UL is a base layer of the etching target film EF and is made of, by way of non-limiting example, silicon or tungsten. The etching target film EF is provided on the underlying layer UL. The etching target film EF may be a silicon oxide film, a silicon nitride film or a multilayered film composed of one or more silicon oxide films and one or more silicon nitride films stacked on top of each other alternately. The mask MK is provided on the etching target film EF. The mask MK is made of, but not limited to, a metal such as tungsten, polycrystalline silicon, or an organic material such as amorphous carbon. The mask MK has an opening. In the method MT, a portion of the etching target film EF exposed through the opening of the mask MK is etched. Further, the mask MK may be provided with multiple openings on the etching target film EF.

Figure 3:
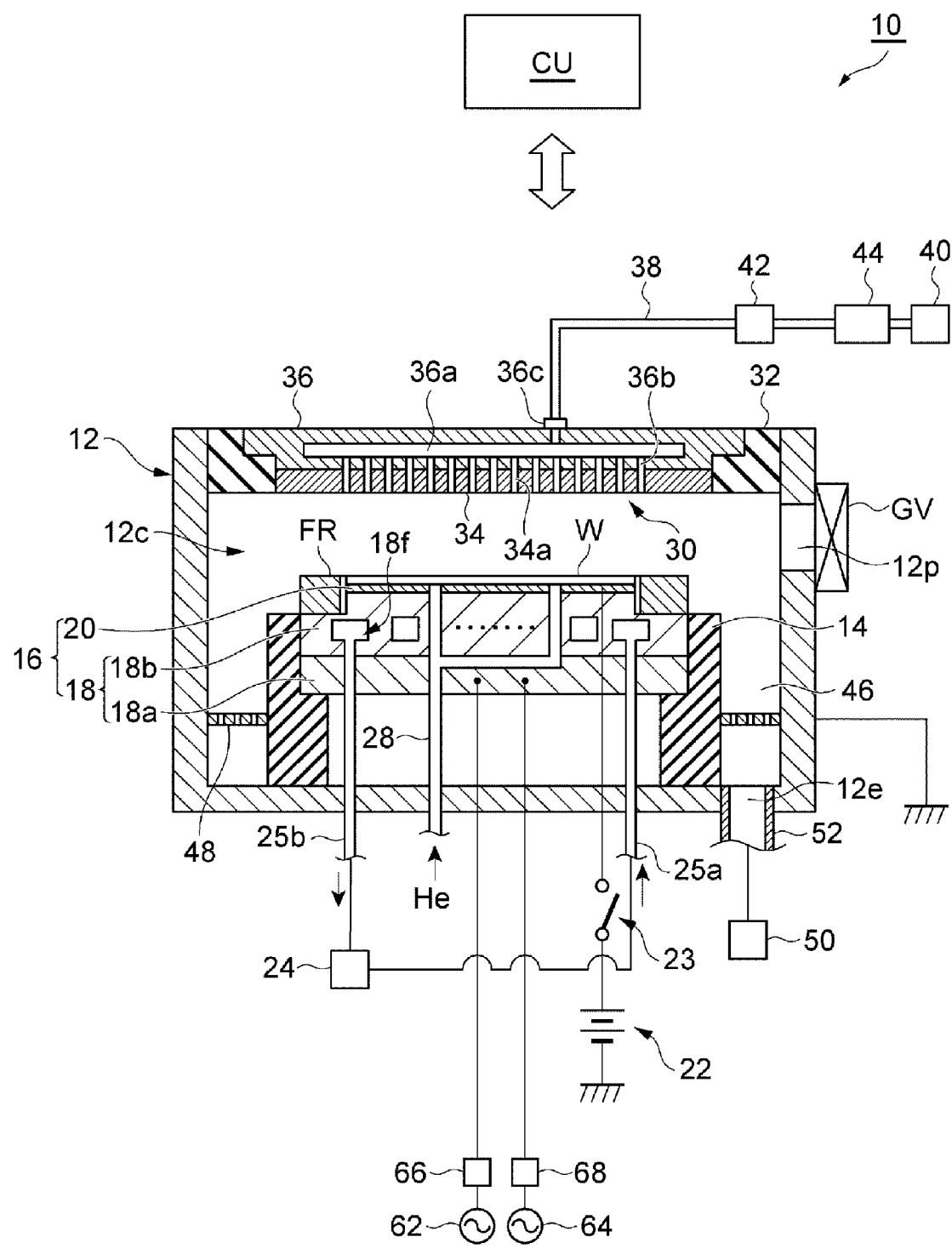
FIG. 3 is a diagram schematically illustrating a plasma processing apparatus that can be used in the method of FIG. 1.

FIG. 3 is a diagram schematically illustrating a plasma processing apparatus that can be used in performing the method of FIG. 1. A plasma processing apparatus 10 shown in FIG. 3 is configured as a capacitively coupled plasma processing apparatus. The plasma processing apparatus 10 includes a chamber main body 12. The chamber main body 12 has a substantially cylindrical shape, and an internal space of the chamber main body 12 is configured as a chamber 12c. The chamber main body 12 is made of a metal such as, but not limited to, aluminum. A film having plasma resistance, for example, an yttrium oxide film is formed on an inner wall surface of the chamber main body 12. The chamber main body 12 is grounded.

Within the chamber 12c, a supporting member 14 is provided on a bottom portion of the chamber main body 12. The supporting member 14 is made of an insulating material. The supporting member 14 has a substantially cylindrical shape. Within the chamber 12c, the supporting member 14 is upwardly extended from the bottom portion of the chamber main body 12. The supporting member 14 is configured to support a stage 16 on an upper portion thereof.

The stage 16 includes a lower electrode 18 and an electrostatic chuck 20. The lower electrode 18 includes a first member 18a and a second member 18b. The first member 18a and the second member 18b are made of a conductor such as, but not limited to, aluminum, and each has a substantially disk shape. The second member 18b is provided on the first member 18a and electrically connected with the first member 18a. The electrostatic chuck 20 is provided on the lower electrode 18.

The electrostatic chuck 20 is configured to hold the processing target object W placed thereon. The electrostatic chuck 20 has a substantially disk-shaped insulating layer and a film-shaped electrode embedded in the insulating layer. The electrode of the electrostatic chuck 20 is electrically connected to a DC power supply 22 via a switch 23. The electrostatic chuck 20 attracts and holds the processing target object W by an electrostatic force generated by a DC voltage applied from the DC power supply 22. A heater may be provided within this electrostatic chuck 20.

A focus ring FR is provided on a peripheral portion of the lower electrode 18 to surround an edge of the processing target object W and an edge of the electrostatic chuck 20. The focus ring FR is provided to improve uniformity of etching. The focus ring FR is made of a material which is appropriately selected depending on a material of the target of the etching.

A path 18f for a coolant is formed in the second member 18b of the lower electrode 18. A heat exchange medium is supplied into the path 18f from a temperature control device 24 provided outside the chamber main body 12 via a pipeline 25a. The heat exchange medium supplied into the path 18f is returned back into the temperature control device 24 through a pipeline 25b. That is, the heat exchange medium is circulated between the temperature control device 24 and the path 18f. As the heat exchange medium whose temperature is adjusted is circulated between the temperature control device 24 and the path 18f, a temperature of the electrostatic chuck 20 and, ultimately, a temperature of the processing target object W is adjusted.

Figure 4:
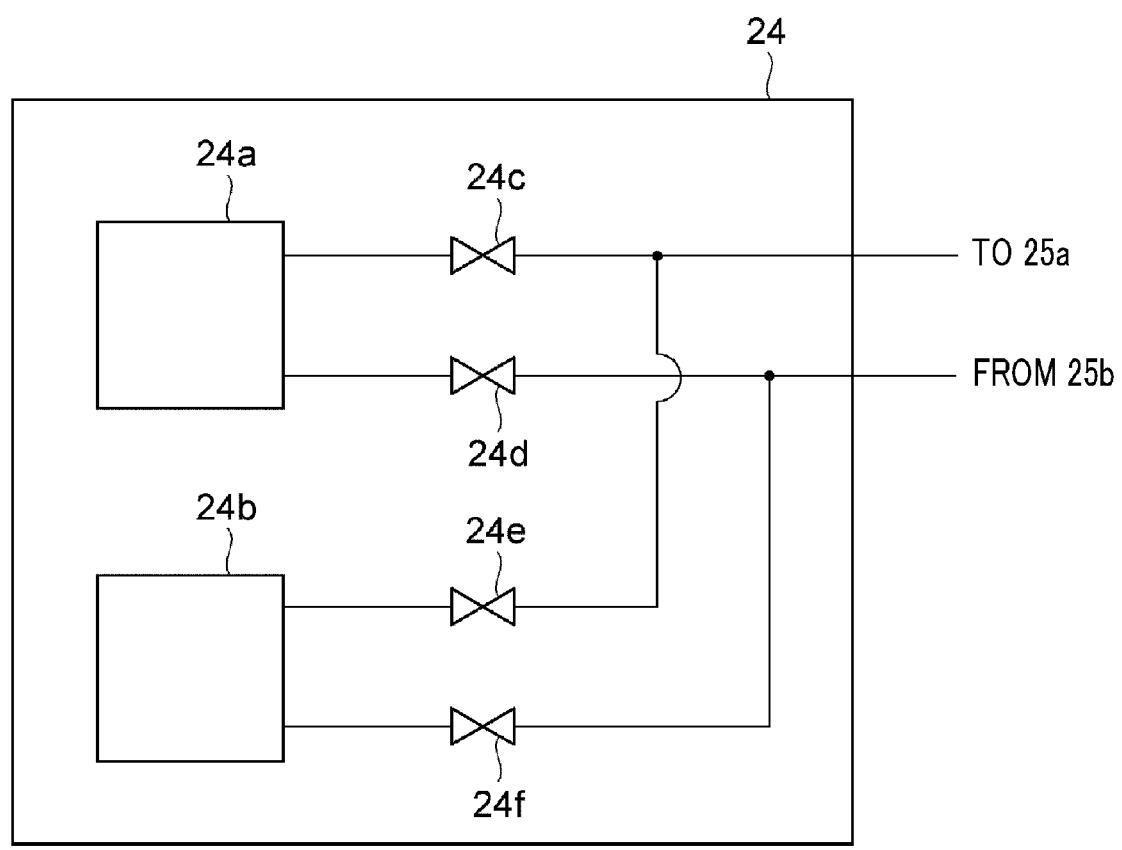
FIG. 4 is a diagram illustrating an example of a temperature control device.

FIG. 4 is a diagram illustrating an example of the temperature control device. As shown in FIG. 4, the example temperature control device 24 includes a first temperature adjuster 24a and a second temperature adjuster 24b. The first temperature adjuster 24a is configured to adjust a temperature of a first heat exchange medium (e.g., brine) and output the first heat exchange medium. The second temperature adjuster 24b is configured to adjust a temperature of a second heat exchange medium (e.g., brine) and output the second heat exchange medium. The temperature of the second heat exchange medium is higher than the temperature of the first heat exchange medium. The first temperature adjuster 24a sets therein the temperature of the first heat exchange medium to, e.g., −70° C. The second temperature adjuster 24b sets therein the temperature of the second heat exchange medium to be in a range from 0° C. to 100° C.

The temperature control device 24 includes a valve 24c, a valve 24d, a valve 24e and a valve 24f. An output port of the first temperature adjuster 24a is connected to the pipeline 25a via the valve 24c. The output port of the first temperature adjuster 24a is a port for outputting the first heat exchange medium. A return port of the first temperature adjuster 24a is connected to the pipeline 25b via the valve 24d. The return port of the first temperature adjuster 24a is a port for receiving the heat exchange medium returned to the first temperature adjuster 24a from the path 18f through the pipeline 25b. An output port of the second temperature adjuster 24b is connected to the pipeline 25a via the valve 24e. The output port of the second temperature adjuster 24b is a port for outputting the second heat exchange medium. A return port of the second temperature adjuster 24b is connected to the pipeline 25b via the valve 24f. The return port of the second temperature adjuster 24b is a port for receiving the heat exchange medium returned to the second temperature adjuster 24b from the path 18f through the pipeline 25b.

When circulating the heat exchange medium between the first temperature adjuster 24a and the path 18f, the valve 24c and the valve 24d are opened, and the valve 24e and the valve 24f are closed. Meanwhile, when circulating the heat exchange medium between the second temperature adjuster 24b and the path 18f, the valve 24c and the valve 24d are closed, and the valve 24e and the valve 24f are opened.

Further, though each of the above-described first temperature adjuster 24a and second temperature adjuster 24b is of a type configured to adjust the temperature of the heat exchange medium flowing therein, each of the first temperature adjuster 24a and the second temperature adjuster 24b may be implemented by a direct expansion type temperature adjuster. In case the each of the first and second temperature adjuster 24a and 24b is the direct expansion type temperature adjuster, each has a compressor, a condenser and an expansion valve, and the stage 16 serves as an evaporator.

The plasma processing apparatus 10 is equipped with a gas supply line 28. Through the gas supply line 28, a heat transfer gas, for example, a He gas, is supplied from a heat transfer gas supply device into a gap between a top surface of the electrostatic chuck 20 and a rear surface of the processing target object W.

The plasma processing apparatus 10 is further equipped with an upper electrode 30. The upper electrode 30 is placed above the stage 16, facing the stage 16. The upper electrode 30 is supported at an upper portion of the chamber main body 12 with an insulating member 32 therebetween. The upper electrode 30 may include a ceiling plate 34 and a supporting body 36. The ceiling plate 34 directly faces the chamber 12c, and is provided with a multiple number of gas discharge holes 34a. This ceiling plate 34 may be made of a conductor or a semiconductor having low resistance with low Joule heat.

The supporting body 36 is configured to support the ceiling plate 34 in a detachable manner, and is made of a conductor such as, but not limited to, aluminum. A gas diffusion space 36a is formed within the supporting body 36. Multiple holes 36b are extended downwards from the gas diffusion space 36a to communicate with the gas discharge holes 34a, respectively. Further, the supporting body 36 is provided with a port 36c through which a gas is introduced into the gas diffusion space 36a, and a pipeline 38 is connected to this port 36c.

The pipeline 38 is connected to a gas source group 40 via a valve group 42 and a flow rate controller group 44. The gas source group 40 includes a plurality of gas sources for supplying a processing gas into the chamber 12c. The processing gas contains a fluorocarbon gas and/or a hydrofluorocarbon gas. As an example, the gas source group 40 includes a source of a fluorocarbon gas, a source of a hydrogen gas ($H_2$ gas), and a source of an oxygen-containing gas. The fluorocarbon gas may be, by way of non-limiting example, a $CF_4$ gas. The oxygen-containing gas may be, but not limited to, an oxygen gas ($O_2$ gas). As another example, the gas source group 40 includes a source of a fluorocarbon gas, a source of a hydrofluorocarbon gas and a source of an oxygen-containing gas. The fluorocarbon gas may be, for example, a $C_4F_8$ gas. The hydrofluorocarbon gas may be, by way of non-limiting example, a $CH_2F_2$ gas. The oxygen-containing gas may be, but not limited to, an oxygen gas ($O_2$ gas). As still another example, the gas source group 40 may additionally include a source of a hydrogen gas ($H_2$ gas), a source of an one or more halogen-containing gas and a source of a hydrocarbon gas. For example, the gas source group 40 may include a source of a $NF_3$ gas as the source of the one or more halogen-containing gas. Moreover, the gas source group 40 may include a source of a $CH_4$ gas as the source of the hydrocarbon gas.

The valve group 42 includes a plurality of valves, and the flow rate controller group 44 includes a plurality of flow rate controllers. Each of the flow rate controllers may be implemented by a mass flow controller or a pressure control type flow rate controller. Each of the gas sources belonging to the gas source group 40 is connected to the pipeline 38 via a corresponding flow rate controller belonging to the flow rate controller group 44 and a corresponding valve belonging to the valve group 42.

A gas exhaust path, having annular shape when viewed from the top, is formed between the stage 16 and a sidewall of the chamber main body 12. A baffle plate 48 is provided at a portion of this gas exhaust path in a vertical direction. The baffle plate 48 may be made of, by way of example, an aluminum member coated with ceramics such as $Y_2O_3$. The chamber main body 12 is also provided with a gas exhaust opening 12e under the baffle plate 48. The gas exhaust opening 12e is connected with a gas exhaust device 50 via a gas exhaust line 52. The gas exhaust device 50 includes a pressure controller and a vacuum pump such as a turbo molecular pump. The gas exhaust device 50 is configured to decompress the chamber 12c to a preset pressure. Further, an opening 12p for carry-in and carry-out of the processing target object W is provided at the sidewall of the chamber main body 12, and the opening 12p is opened/closed by a gate valve GV.

The plasma processing apparatus 10 further includes a first high frequency power supply 62 and a second high frequency power supply 64. The first high frequency power supply 62 is configured to generate a first high frequency power for plasma generation. A frequency of the first high frequency power is in a range from 27 MHz to 100 MHz, for example, 100 MHz. The first high frequency power supply 62 is connected to the lower electrode 18 via a matching device 66. The matching device 66 is equipped with a circuit configured to match an output impedance of the first high frequency power supply 62 and an input impedance at a load side (lower electrode 18 side). The first high frequency power supply 62 may be connected to the upper electrode 30 via the matching device 66.

The second high frequency power supply 64 is configured to generate a second high frequency power for ion attraction into the processing target object W. A frequency of the second high frequency power ranges from 400 kHz to 13.56 MHz, for example, 3 MHz. The second high frequency power supply 64 is connected to the lower electrode 18 via a matching device 68. The matching device 68 is equipped with a circuit configured to match an output impedance of the second high frequency power supply 64 and the input impedance at the load side (lower electrode 18 side).

The plasma processing apparatus 10 may further include a control unit CU. The control unit CU is implemented by a computer including a processor, a storage unit, an input device, a display device and the like. The control unit CU is configured to control individual components of the plasma processing apparatus 10. In the control unit CU, an operator can input commands through the input device to manage the plasma processing apparatus 10. Further, an operational status of the plasma processing apparatus 10 can be visually displayed on the display device. Further, the storage unit of the control unit CU stores therein recipe data and control programs for controlling various processings performed in the plasma processing apparatus 10 by the processor. For example, the storage unit of the control unit CU stores therein control programs for implementing the method MT in the plasma processing apparatus 10 and recipe data.

Figure 5:
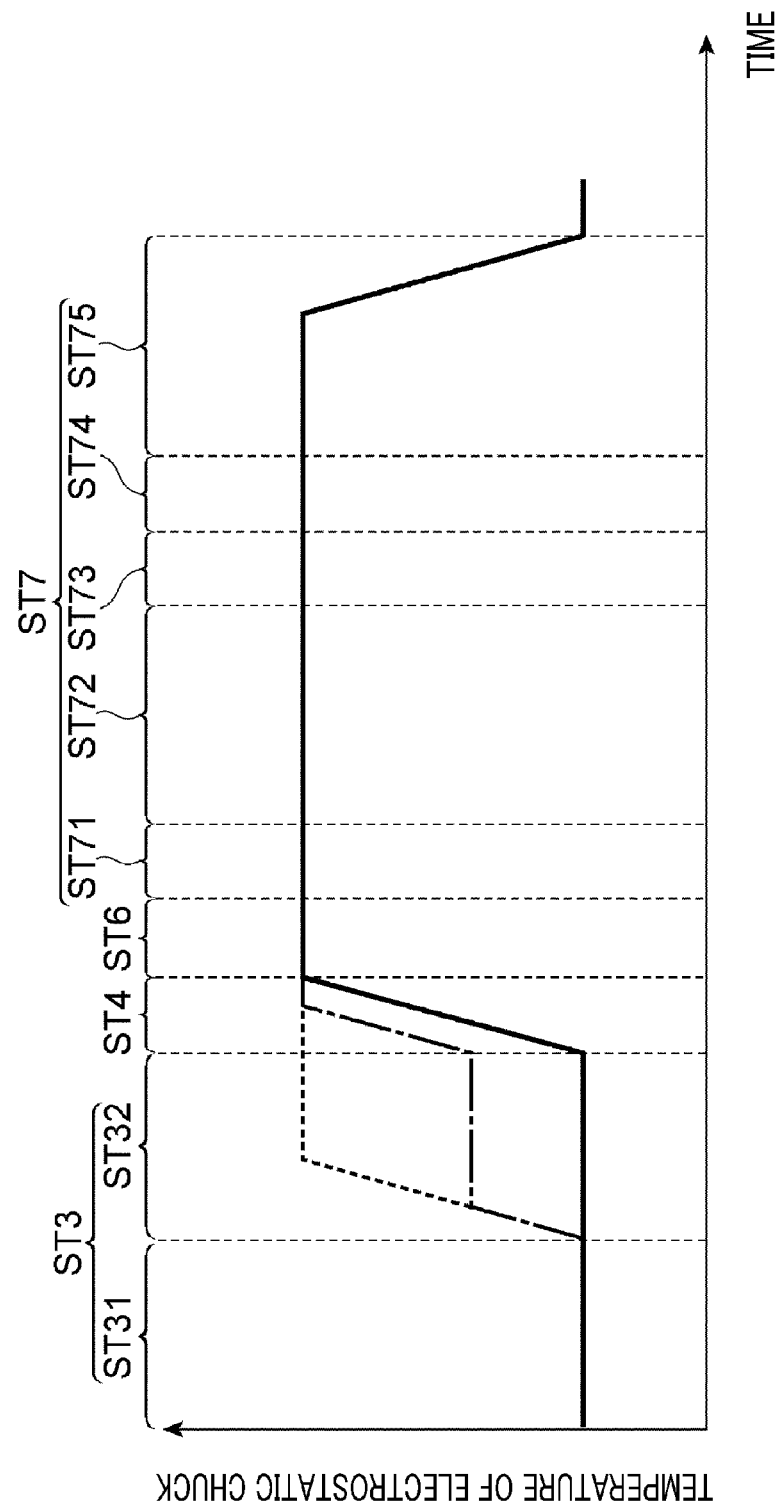
FIG. 5 is a timing chart regarding the method shown in FIG. 1.
Figure 6:
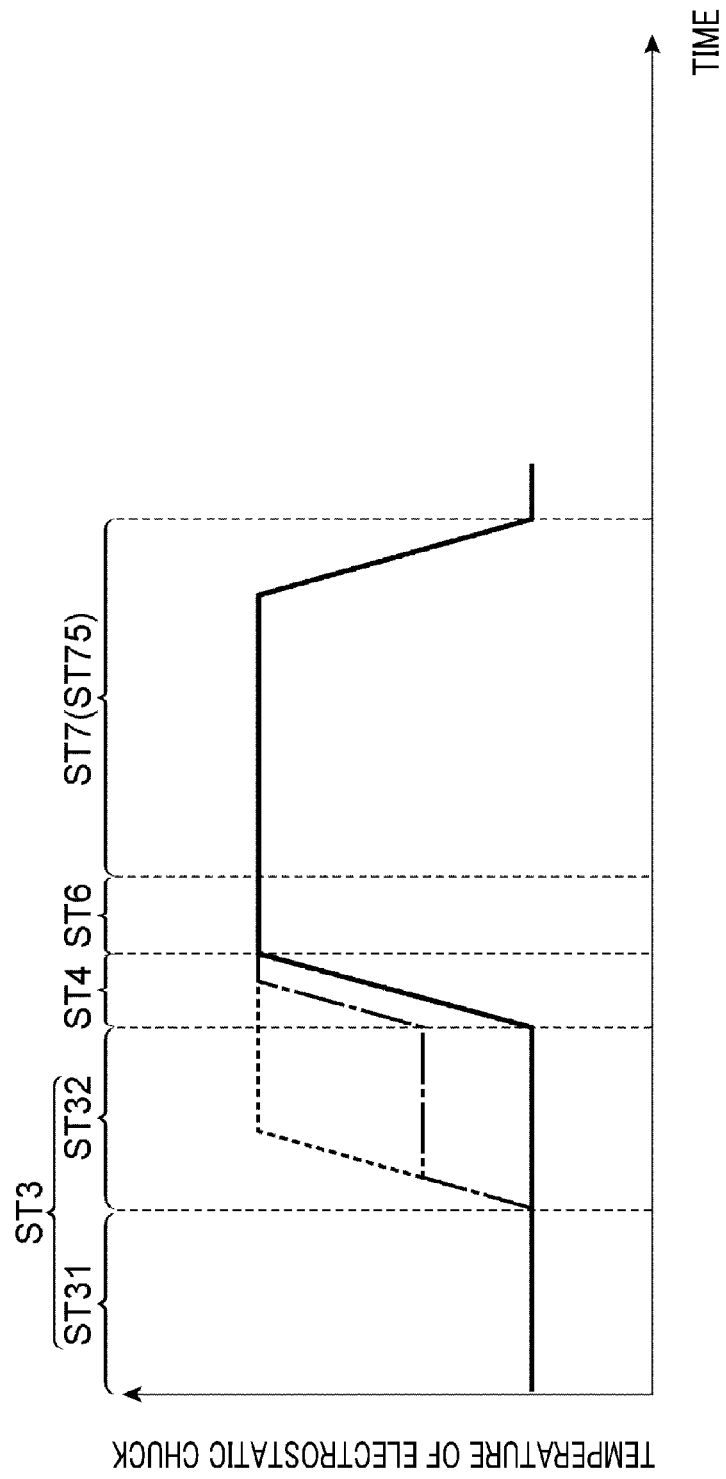
FIG. 6 is a timing chart regarding the method shown in FIG. 1.

Now, referring back to FIG. 1, the method MT will be explained for an example case where the method MT is performed on the processing target object W shown in FIG. 2 by using the plasma processing apparatus 10. In FIG. 1, two parallel double lines indicate that two or more of a plurality of processes drawn between the two parallel double lines are performed in parallel. Hereinafter, reference is also made to FIG. 5 and FIG. 6 as well as FIG. 1. FIG. 5 and FIG. 6 are timing charts regarding the method MT.

As depicted in FIG. 1, the method MT is begun from a process ST1. In the process ST1, a temperature of the electrostatic chuck 20 is set to a temperature equal to or less than −30° C. for main etching to be described later. In the process ST1, the coolant is circulated between the first temperature adjuster 24a and the path 18f.

In a subsequent process ST2, the processing target object W is carried into the chamber 12c. In the process ST2, the processing target object W is placed on and held by the electrostatic chuck 20. Further, the process ST1 may be performed after the process ST2.

Then, a process ST3 is performed. In the process ST3, the etching target film EF of the processing target object W is etched. In the process ST3, plasma of the processing gas containing a fluorocarbon gas and/or a hydrofluorocarbon gas is generated in the chamber 12c. As an example, the processing gas contains a fluorocarbon gas and a hydrogen gas ($H_2$ gas). The fluorocarbon gas may be, by way of example, but not limitation, a $CF_4$ gas. As another example, the processing gas contains a fluorocarbon gas, a hydrofluorocarbon gas, a hydrogen gas ($H_2$ gas), an one or more halogen-containing gas and a hydrocarbon gas. For example, the processing gas may contain a $CH_2F_2$ gas, a $C_4F_8$ gas, a $H_2$ gas, a $CH_4$ gas and a $NF_3$ gas. To elaborate, in the process ST3, the processing gas is supplied into the chamber 12c from the gas source group 40. Further, an internal pressure of the chamber 12c is set to a preset pressure by the gas exhaust device 50. Further, the first high frequency power is output from the first high frequency power supply 62 for plasma generation. As a result, the plasma of the processing gas is generated within the chamber 12c. Here, when necessary, the second high frequency power may be supplied to the lower electrode 18 from the second high frequency power supply 64. In the process ST3, the etching target film EF is etched by ions and/or radicals in the plasma.

The process ST3 includes a main etching ST31 and an overetching ST32. In the main etching ST31, the etching target film EF is etched by the ions and/or radicals in the plasma of the aforementioned processing gas in a state (see FIG. 5) that the temperature of the electrostatic chuck 20 is set to the temperature equal to or less than −30° C. by the temperature control device 24. If the etching target film EF is etched by the ions and/or radicals in the plasma of the aforementioned processing gas in the state that the temperature of the electrostatic chuck 20, i.e., the temperature of the processing target object W is set to the temperature equal or less than −30° C., an etching rate of the etching target film EF is increased.

The overetching ST32 is performed after the main etching ST31. In case that the mask MK has the multiple openings, the etching target film EF may not be etched uniformly under the multiple openings of the mask MK by the etching in the main etching ST31. That is, when the etching target film EF is etched by the main etching ST31 until the underlying layer UL under a part of the openings of the mask MK is exposed, the etching target film EF may be slightly left on the underlying layer UL under another part of the openings of the mask MK. The overetching ST32 is performed to etch the etching target film EF left under this another part of the openings of the mask MK so that the etching target film EF is etched uniformly under all the openings of the mask MK.

In the overetching ST32, the etching target film EF is etched by the ions and/or the radicals in the plasma of the aforementioned processing gas. In the exemplary embodiment, the overetching ST32 is performed in a state that the temperature of the electrostatic chuck 20, that is, the temperature of the processing target object W is set to a temperature higher than −30° C. and lower than 0° C. by the temperature control device 24. Reference may be made to the temperature of the electrostatic chuck, indicated by a dashed dotted line, in a processing time period of the overetching ST32 in FIG. 5. If the temperature of the processing target object W in the overetching ST32 is higher than the temperature of the processing target object W in the main etching ST31, the etching rate of the etching target film EF by the overetching ST32 is reduced. Accordingly, controllability over an etching amount of the etching target film EF can be improved. Further, damage on the underlying layer UL is suppressed. However, it should be noted that the temperature of the electrostatic chuck 20 when the overetching ST32 is being performed may not be limited to the aforementioned temperature higher than −30° C. and lower than 0° C.

Then, in the method MT, a process ST4 is performed. In the process ST4, neutralization of the electrostatic chuck 20 is performed. In the neutralization of the electrostatic chuck 20, a voltage having an opposite polarity to a voltage applied to the electrode of the electrostatic chuck 20 when the electrostatic chuck 20 is holding the processing target object W is applied to the electrode of the electrostatic chuck 20.

Figure 7:
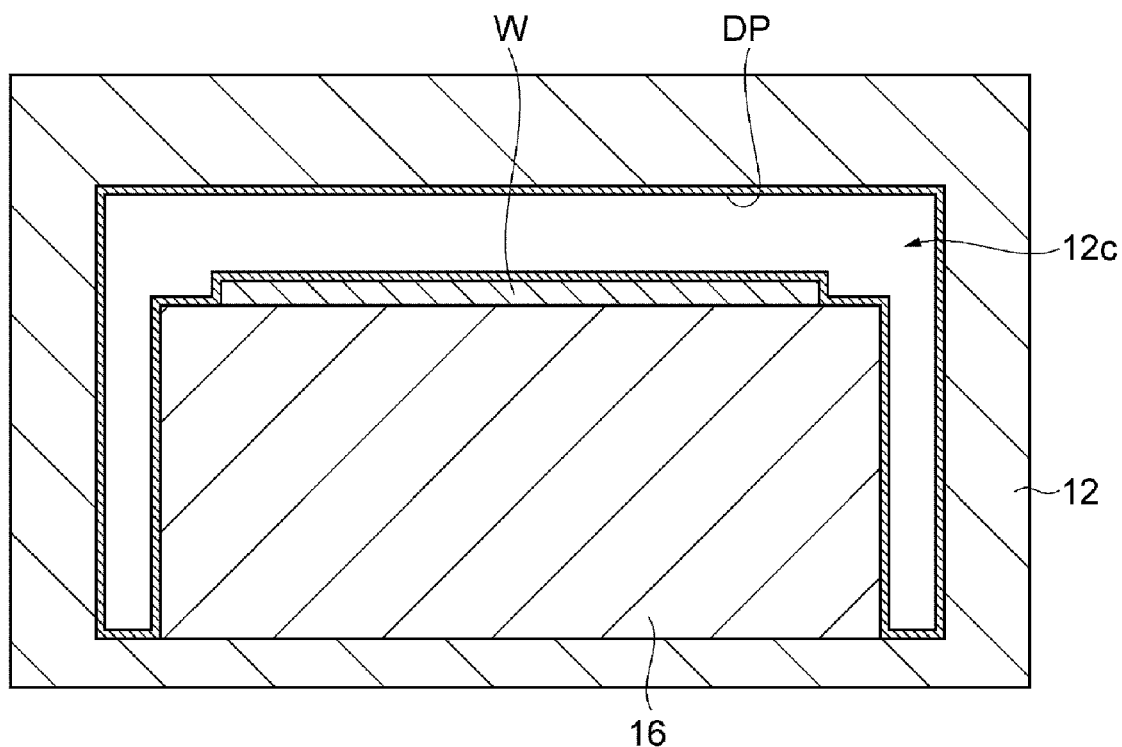
FIG. 7 is a diagram showing a state in which a deposit is formed.

FIG. 7 is a diagram illustrating a state in which a deposit is formed. If the plasma of the aforementioned processing gas is generated, a plasma product containing carbon or a plasma product containing carbon and fluorine is generated. This plasma product adheres to an inner wall surface of the chamber main body 12 and forms the deposit when the etching of the process ST3 is being performed. Especially, this plasma product is immediately condensed or solidified at a low-temperature place, so that a thick deposit is formed. Thus, if the temperatures of the electrostatic chuck 20 and the processing target object W are maintained to be equal to or lower than −30° C. after the completion of the etching of the process ST3, a gas generated from the deposit adhering to the inner wall surface of the chamber main body 12 may be condensed or solidified on the processing target object W, so that a thick deposit is formed thereon. Resultantly, as depicted in FIG. 7, a deposit DP is formed on the inner wall surface of the chamber main body 12, a surface of the stage 16 and a surface of the processing target object W.

Here, an experiment conducted to investigate the formation of the deposit will be explained. In the experiment, the main etching ST31 is performed in the plasma processing apparatus 10, and a deposition rate of the deposit on the inner wall surface of the chamber main body 12 is measured. In this experiment, the temperature of the electrostatic chuck 20 when the main etching ST31 is being performed is varied as a parameter. In the main etching ST31 of the experiment, a pressure of the chamber 12c is set to 60 mTorr (7.999 Pa); a frequency and a power of the first high frequency power, 40 MHz and 1 kW; and a power of the second high frequency power, 0 kW, and a mixed gas of a $H_2$ gas (150 sccm) and a $CF_4$ gas (100 sccm) is used as the processing gas.

Figure 8:
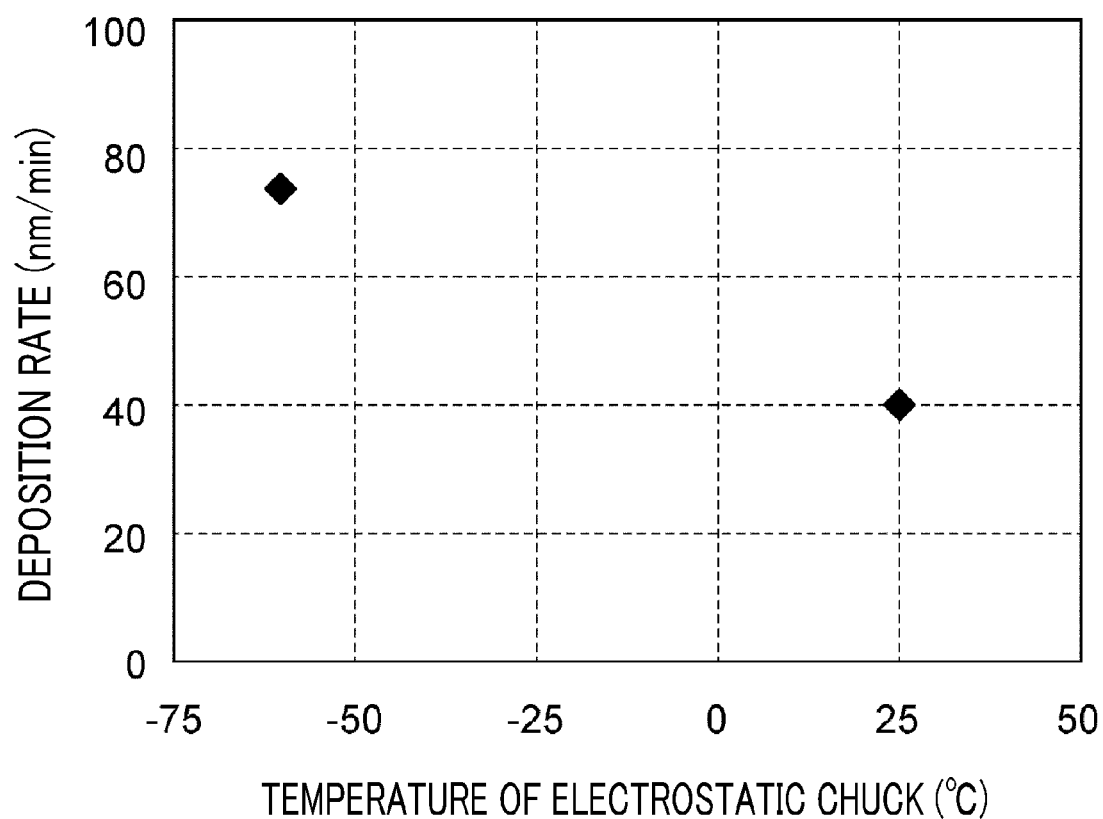
FIG. 8 is a graph showing a result of an experiment.

A graph of FIG. 8 shows the deposition rate of the deposit on the inner wall surface of the chamber main body 12 obtained in the experiment. On the graph of FIG. 8, a horizontal axis represents the temperature of the electrostatic chuck 20 when the main etching ST31 is being performed, and a vertical axis indicates the deposition rate of the deposit. As can be seen from FIG. 8, the deposition rate when the temperature of the electrostatic chuck 20 is −60° C. when the main etching ST31 is being performed is about twice as high as the deposition rate when the temperature of the electrostatic chuck 20 is 25° C. when the main etching ST31 is being performed. Accordingly, it is found out that the thick deposit DP is formed within the chamber main body 12 in the process ST3 including the main etching ST31 in which the temperature of the electrostatic chuck 20 is set to be equal to or lower than −30° C.

The deposit DP formed within the chamber main body 12 is removed by a cleaning of a process ST7 to be described later. Since, however, the processing target object W is carried out of the chamber 12c before the process ST7 is performed, the deposit DP on the processing target object W needs to be reduced or removed before the processing target object W is carried out of the chamber 12c. For the purpose, a process ST5 is performed in the method MT. In the process ST5, the temperature of the electrostatic chuck 20 is raised to be equal to or higher than 0° C. Accordingly, the temperature of the processing target object W is also raised to the temperature equal to or higher than 0° C. In the process ST5, the second heat exchange medium is circulated between the second temperature adjuster 24b and the path 18f. If the temperature of the electrostatic chuck 20 is set to be 0° C. or higher, the amount of the deposit DP on the processing target object W may be reduced or the deposit DP may hardly exist on the processing target object W.

In one exemplary embodiment, the process ST5 is performed immediately after the process ST3. To elaborate, the process ST5 is performed during the neutralization of the electrostatic chuck 20 in the process ST4. Reference may be made to the temperature of the electrostatic chuck, indicated by a solid line, in a processing time period of the process ST4 in FIG. 5. As a result of performing this process ST5, the temperatures of the electrostatic chuck 20 and the processing target object W are raised immediately after the process ST3 is performed.

In another exemplary embodiment, the process ST5 is performed immediately after the main etching ST31. To elaborate, the process ST5 may be performed in parallel with the overetching ST32. Reference may be made to the temperature of the electrostatic chuck, indicated by a dashed line, in the processing time period of the overetching ST32 in FIG. 5. As a result of this process ST5, the temperatures of the electrostatic chuck 20 and the processing target object W are raised immediately after the main etching ST31 is performed.

In the method MT, a process ST6 is subsequently performed. In the process ST6, the processing target object W is carried out of the chamber 12c. When the process ST6 is being performed, the temperature of the electrostatic chuck 20 is maintained to be equal to or higher than 0° C., as shown in FIG. 5.

Thereafter, in the method MT, the process ST7 is performed. In the process ST7, the cleaning of the inside of the chamber main body 12 is performed. In the cleaning, plasma of a cleaning gas is generated within the chamber 12c. The cleaning gas includes an oxygen-containing gas. The oxygen-containing gas may be, by way of example, but not limitation, an oxygen gas ($O_2$ gas), a carbon monoxide gas or a carbon dioxide gas. Since the deposit DP contains carbon or contains carbon and fluorine, the deposit DP is removed by the plasma of this cleaning gas. A time period for this cleaning may be a cause of a reduction of a throughput of a plasma processing in the plasma processing apparatus. Thus, it is desirable that the time period for the cleaning is short.

Here, an experiment conducted regarding the cleaning will be explained. In this experiment, an organic film as a sample of the deposit DP is etched by generating the plasma of the cleaning gas within the chamber of the plasma processing apparatus 10. In this experiment, the temperature of the electrostatic chuck 20 is varied as a parameter. In this experiment, a pressure of the chamber 12c is set to 400 mTorr (53.33 Pa); a frequency and a power of the first high frequency power, 40 MHz and 1 kW; and a power of the second high frequency power, 0 kW, and an $O_2$ gas (100 sccm) is used as the cleaning gas.

Figure 9:
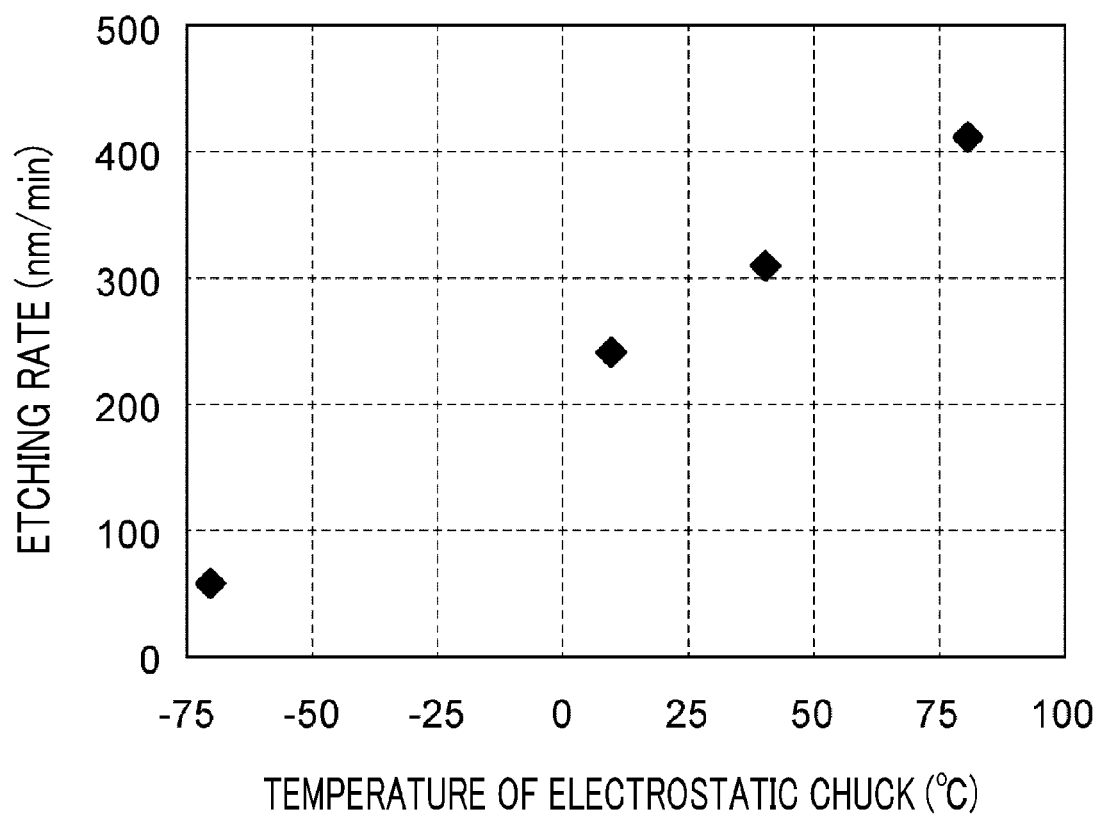
FIG. 9 is a graph showing a result of an experiment.

In this experiment, an etching rate of the organic film is measured. FIG. 9 shows the result. In FIG. 9, a horizontal axis represents the temperature of the electrostatic chuck 20 when the etching of the organic film is being performed, and a vertical axis indicates the etching rate of the organic film.

As can be seen from FIG. 9, when the temperature of the electrostatic chuck 20 is low when the etching of the organic film is being performed, the etching rate of the organic film is very low. Meanwhile, if the temperature of the electrostatic chuck 20 when the etching of the organic film is being performed is set to be 0° C. or higher, the etching rate of the organic film is increased considerably. Accordingly, it is found out that the temperature of the electrostatic chuck 20 needs to be set to be equal to or higher than 0° C. when the process ST7 is being performed.

In one exemplary embodiment, the process ST7 includes, as shown in FIG. 5, a process ST71, a process ST72, a process ST73, a process ST74 and a process ST75. In the process ST71, a dummy wafer is carried into the chamber 12c for the cleaning and is held by the electrostatic chuck 20.

In the subsequent process ST72, plasma of a cleaning gas is generated within the chamber 12c. The cleaning gas includes an oxygen-containing gas. The oxygen-containing gas may be, by way of non-limiting example, an oxygen gas ($O_2$ gas), a carbon monoxide gas or a carbon dioxide gas. In the process ST72, the cleaning gas is supplied into the chamber 12c from the gas source group 40. Further, the first high frequency power is supplied from the first high frequency power supply 62 for plasma generation.

In the subsequent process ST73, the neutralization of the electrostatic chuck 20 is performed. This neutralization of the electrostatic chuck 20 is the same process as the process ST4. In the process ST74, the dummy wafer is carried out of the chamber 12c.

Figure 10:
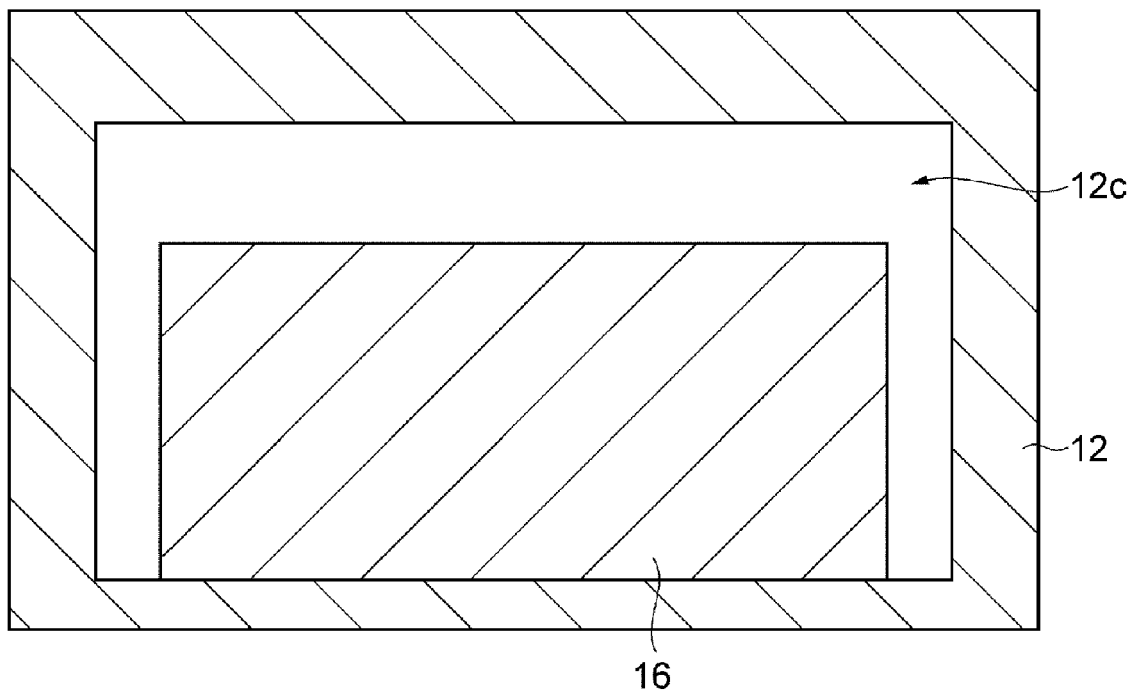
FIG. 10 is a diagram showing a state after a process ST7 is performed.

Then, in the process ST75, plasma of a cleaning gas is generated within the chamber 12c in a state that an object such as the dummy wafer is not placed on the electrostatic chuck 20. In the process ST75, the cleaning gas is the same gas as the cleaning gas in the process ST72. Further, the generation of the plasma in the process ST75 is performed in the same way as in the process ST72. FIG. 10 is a diagram illustrating a state after the process ST7 is completed. As depicted in FIG. 10, by performing the process ST7, the deposit DP is removed from the inner wall surface of the chamber main body 12 and the surface of the stage 16.

In this exemplary embodiment, as shown in FIG. 5, the temperature of the electrostatic chuck 20 is maintained to be equal to or higher than 0° C. until a certain time within a processing time of the process ST75 after the temperature of the electrostatic chuck 20 is increased in the process ST5. When the temperature of the electrostatic chuck 20 is maintained to be equal to or higher than 0° C., the second heat exchange medium is supplied into the path 18f from the second temperature adjuster 24b. Since the temperature of the electrostatic chuck 20 is set to be equal to or higher than 0° C. during the cleaning of the process ST7, a removing rate of the deposit DP is increased. Accordingly, the time period for the cleaning of the inside of the chamber main body 12 is shortened.

In another exemplary embodiment, as shown in FIG. 6, the process ST7 includes only the process ST75. That is, immediately after the processing target object W is carried out of the chamber 12c in the process ST6, the process ST75 is performed. In the process ST75, the plasma of the cleaning gas is generated within the chamber 12c in a state that an object such as the dummy wafer is not placed on the electrostatic chuck 20. As depicted in FIG. 6, the temperature of the electrostatic chuck 20 is maintained to be equal to or higher than 0° C. until a certain time within a processing time of the process ST75 after the temperature of the electrostatic chuck 20 is increased in the process ST5. When the temperature of the electrostatic chuck 20 is maintained to be equal to or higher than 0° C., the second heat exchange medium is supplied into the path 18f from the second temperature adjuster 24b. Since the temperature of the electrostatic chuck 20 is set to be equal to or higher than 0° C. during the cleaning of the process ST7, the removing rate of the deposit DP is increased. Accordingly, the time period for the cleaning of the inside of the chamber main body 12 is shortened.

Referring back to FIG. 1, in the method MT, a process ST8 is then performed. In the process ST8, it is determined whether another processing target object is to be processed. In case of processing another processing target object, the processing is performed again from the process ST1. Meanwhile, if another processing target object is not processed, the method MT is ended.

As stated above, in the exemplary embodiment, since the temperature of the electrostatic chuck 20 and, ultimately, the temperature of the processing target object W are raised to the temperature equal to or higher than 0° C. immediately after the process ST3 or the main etching ST31 is performed, the deposit DP on the processing target object W is removed or the amount thereof is reduced by the time when the processing target object W is carried out of the chamber.

In the exemplary embodiment, the process ST5 is performed when the process ST4 is performed, as described above. That is, the process ST5 is performed in parallel with the neutralization of the electrostatic chuck 20 which is performed in a time period between the process ST3 and the process ST6. Accordingly, an additional time period only for raising the temperature of the electrostatic chuck 20 is not necessary. Therefore, a time period from the end of the etching of the process ST3 to the start of the process ST7 can be shortened.

In another exemplary embodiment, the process ST5 is performed when the overetching ST32 is performed, as stated above. That is, the raising of the temperature of the electrostatic chuck 20 in the process ST5 is performed in parallel with the overetching ST32. Accordingly, an additional time period only for raising the temperature of the electrostatic chuck 20 is not necessary. Therefore, the time period from the end of the etching of the process ST3 to the start of the process ST7 can be shortened.

Furthermore, by using the temperature control device 24, when starting the performing of the process ST5, it is possible to switch the heat exchange medium supplied into the path 18f at a high speed from the first heat exchange medium of the low temperature to the second heat exchange medium of the high temperature.

Figure 11:
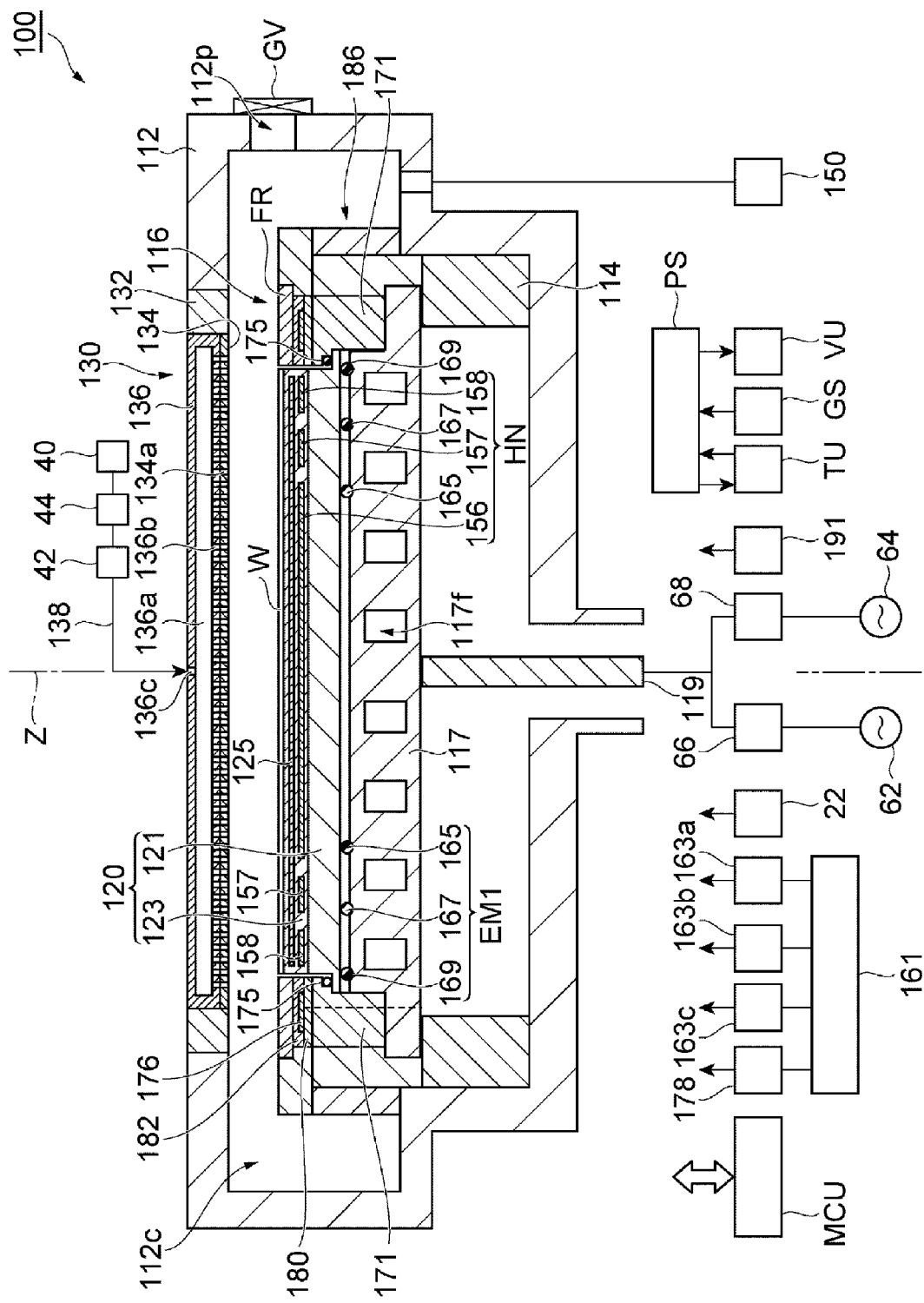
FIG. 11 is a diagram schematically illustrating another example of a plasma processing apparatus that can be used to perform the method of FIG. 1.

Now, a plasma processing apparatus according to another exemplary embodiment that can be used in performing the method MT will be explained. FIG. 11 is a diagram schematically illustrating the plasma processing apparatus according to another exemplary embodiment that can be used in performing the method shown in FIG. 1. A plasma processing apparatus 100 shown in FIG. 11 is configured as a capacitively coupled plasma processing apparatus. The plasma processing apparatus 100 includes a chamber main body 112 and a stage 116. The chamber main body 112 has a substantially cylindrical shape, and an internal space of the chamber main body 112 is configured as a chamber 112c. The chamber main body 112 is made of, by way of example, aluminum. A film made of ceramic such as an yttrium oxide film, which has plasma resistance, is formed on a surface of the chamber main body 112 at a chamber 112c side. The chamber main body 112 is grounded. Further, an opening 112p through which a processing target object W is carried into/out of the chamber 112c is provided at a side wall of the chamber main body 112. This opening 112p is configured to be opened/closed by a gate valve GV.

The stage 116 is configured to support the processing target object W within the chamber 112c. The stage 116 has a function of attracting the processing target object W and adjusting a temperature of the processing target object W, and has a structure in which a high frequency power is sent to a base of an electrostatic chuck. Details of this stage 116 will be discussed later.

The plasma processing apparatus 100 is further equipped with an upper electrode 130. The upper electrode 130 is placed within a top opening of the chamber main body 112 and is arranged to be substantially parallel to a lower electrode of the stage 116. An insulating supporting member 132 is provided between the upper electrode 130 and the chamber main body 112.

The upper electrode 130 includes a ceiling plate 134 and a supporting body 136. The ceiling plate 134 has a substantially disk shape. The ceiling plate 134 may have conductivity. Further, the ceiling plate 134 is made of, by way of non-limiting example, silicon. Alternatively, the ceiling plate 134 is made of aluminum, and a ceramic film having plasma resistance is formed on a surface of the ceiling plate 134. The ceiling plate 134 is provided with a multiple number of gas discharge holes 134a. These gas discharge holes 134a are extended in a substantially vertical direction.

The supporting body 136 is configured to support the ceiling plate 134 in a detachable manner, and is made of, by way of non-limiting example, aluminum. A gas diffusion space 136a is formed within the supporting body 136. Multiple holes 136b are extended from the gas diffusion space 136a to communicate with the gas discharge holes 134a, respectively. A pipeline 138 is connected to the gas diffusion space 136a via a port 136c. A gas source group 40 is connected to this pipeline 138 via a valve group 42 and a flow rate controller group 44 in the same way as in the plasma processing apparatus 10.

The plasma processing apparatus 100 is further equipped with a gas exhaust device 150. The gas exhaust device 150 includes one or more vacuum pumps such as turbo molecular pumps and a pressure controller. This gas exhaust device 150 is connected to a gas exhaust port formed at the chamber main body 112.

The plasma processing apparatus 100 further includes a control unit MCU. The control unit MCU has the same configuration as the control unit CU of the plasma processing apparatus 10. Recipe data and a control program for controlling various processings performed in the plasma processing apparatus 100 by the processor are stored in a storage unit of the control unit MCU. By way of example, recipe data and control programs for implementing the method MT in the plasma processing apparatus 100 are stored in the storage unit of the control unit MCU.

Figure 12:
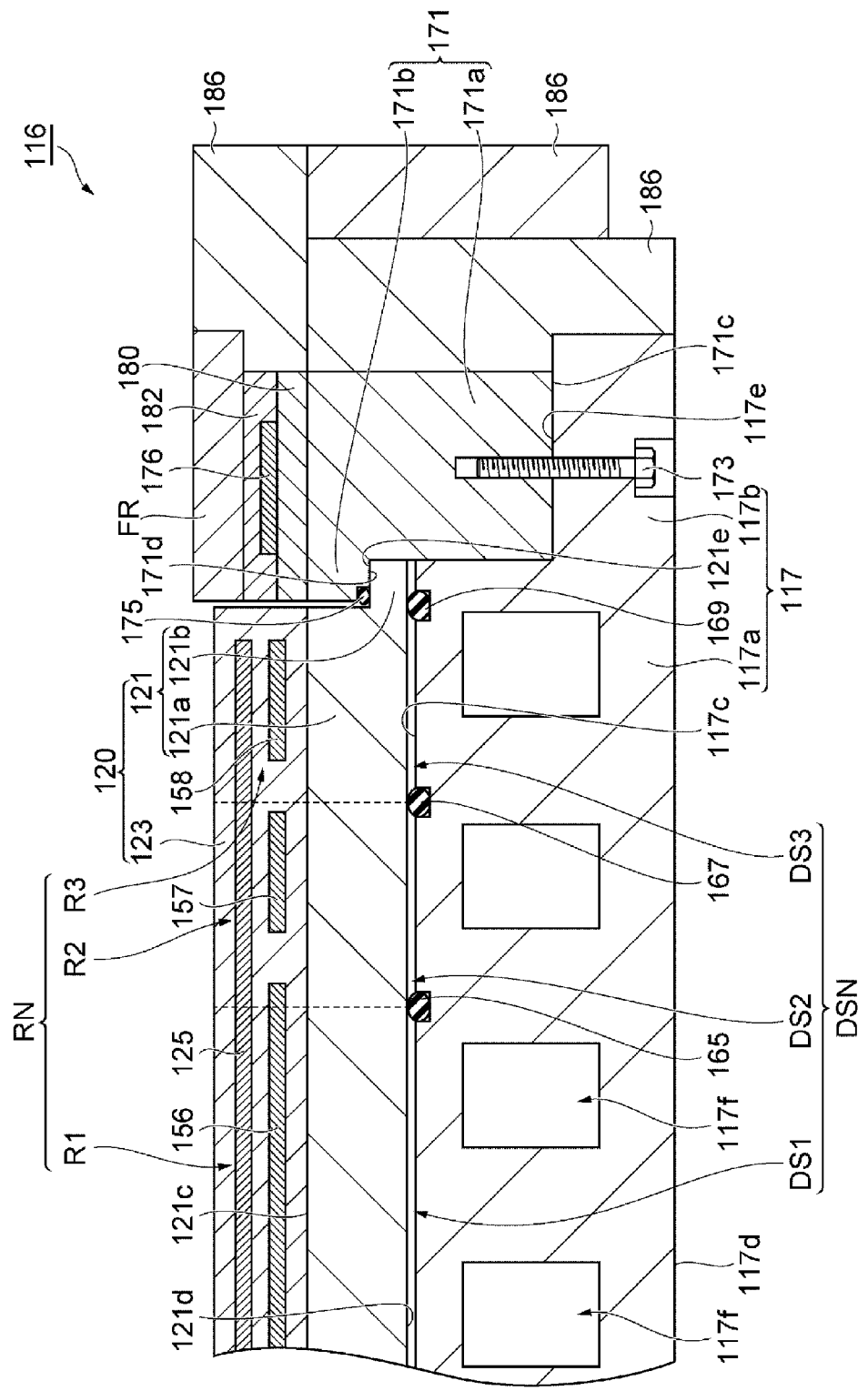
FIG. 12 is an enlarged cross sectional view illustrating a part of a stage of the plasma processing apparatus shown in FIG. 11.
Figure 13:
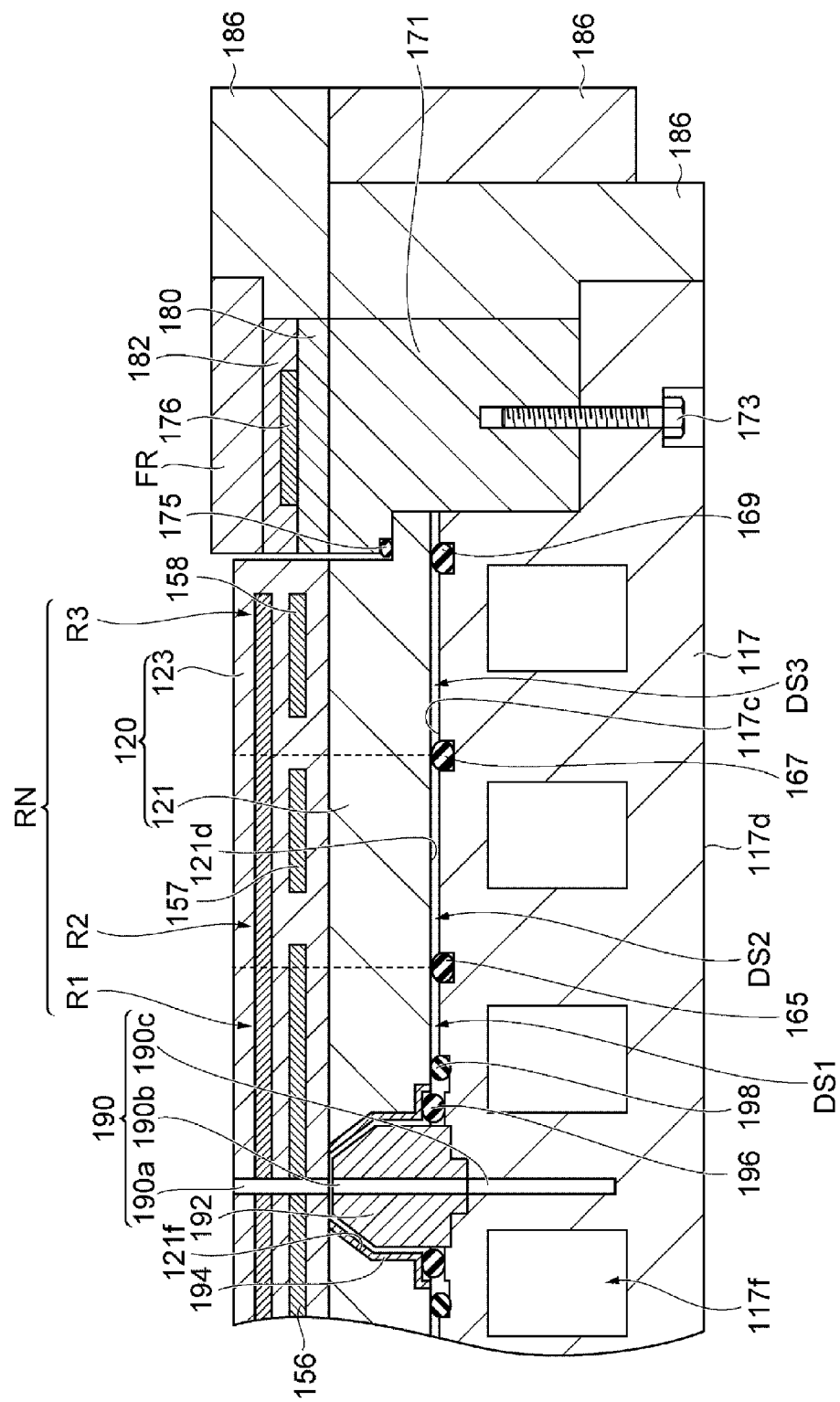
FIG. 13 is an enlarged cross sectional view illustrating another part of the stage of the plasma processing apparatus shown in FIG. 11.

Now, with reference to FIG. 12 and FIG. 13 in addition to FIG. 11, the stage 116 and constituent components of the plasma processing apparatus 100 belonging to the stage 116 will be discussed in detail. FIG. 12 is an enlarged sectional view illustrating a part of the stage of the plasma processing apparatus shown in FIG. 11, and FIG. 13 is an enlarged sectional view illustrating another part of the stage of the plasma processing apparatus illustrated in FIG. 11.

The stage 116 includes a cooling table 117 and an electrostatic chuck 120. The cooling table 117 is supported by a supporting member 114 upwardly extended from a bottom portion of the chamber main body 112. This supporting member 114 is implemented by an insulating member and is made of, by way of non-limiting example, aluminum oxide (alumina). Further, the supporting member 114 has a substantially cylindrical shape.

The cooling table 117 is made of a conductive metal, for example, aluminum. The cooling table 117 has a substantially disk shape. The cooling table 117 has a central portion 117a and a peripheral portion 117b. The central portion 117a has a substantially disk shape. The central portion 117a provides a first top surface 117c of the cooling table 117. The first top surface 117c is of a substantially circular shape.

The peripheral portion 117b is continuous with the central portion 117a, and is extended in a circumferential direction (a circumferential direction with respect to a vertically extended axis line Z) at an outside of the central portion 117a in a diametric direction (a radial direction with respect to the axis line Z). The peripheral portion 117b provides a bottom surface 117d of the cooling table 117 along with the central portion 117a. Further, the peripheral portion 117b provides a second top surface 117e. The second top surface 117e is a band-shaped surface, and is located outside the first top surface 117c in the diametric direction and extended in the circumferential direction. Further, in the vertical direction, the second top surface 117e is located closer to the bottom surface 117d than the first top surface 117c is.

The cooling table 117 is connected with a power feed body 119. The power feed body 119 is, for example, a power feed rod and is connected to the bottom surface 117d of the cooling table 117. The power feed body 119 is made of aluminum or an aluminum alloy. The power feed body 119 is connected to a first high frequency power supply 62 via a matching device 66. Further, the power feed body 119 is connected with a second high frequency power supply 64 via a matching device 68.

The cooling table 117 is provided with a path 117f for a coolant. The path 117f is extended in, for example, a spiral shape within the cooling table 117. The coolant is supplied into the path 117f from a chiller unit TU. The chiller unit TU constitutes a part of a temperature control device according to the exemplary embodiment. The coolant supplied into the path 117f is returned back to the chiller unit TU. Here, the coolant supplied into the path 117f may be of a type in which heat is absorbed by vaporization thereof to perform cooling. This coolant may be, for example, a hydrofluorocarbon-based coolant.

The electrostatic chuck 120 is provided on the cooling table 117. To elaborate, the electrostatic chuck 120 is provided on the first top surface 117c of the cooling table 117. The electrostatic chuck 120 has a base 121 and an attracting member 123. The base 121 constitutes a lower electrode and is provided on the cooling table 117. The base 121 has conductivity. By way of non-limiting example, the base 121 may be made of ceramic such as aluminum nitride or silicon carbide having conductivity, or made of a metal (e.g., titanium).

The base 121 has a substantially disk shape. The base 121 has a central portion 121a and a peripheral portion 121b. The central portion 121a has a substantially disk shape. The central portion 121a provides a first top surface 121c of the base 121. The first top surface 121c is of a substantially circular shape.

The peripheral portion 121b is continuous with the central portion 121a and is extended in a circumferential direction at an outside of the central portion 121a in a diametric direction. The peripheral portion 121b provides a bottom surface 121d of the base 121 along with the central portion 121a. Further, the peripheral portion 121b provides a second top surface 121e. The second top surface 121e is a band-shaped surface and extended in the circumferential direction at an outside of the first top surface 121c in the diametric direction. Further, in the vertical direction, the second top surface 121e is located closer to the bottom surface 121d than the first top surface 121c is.

The attracting member 123 is provided on the base 121. The attracting member 123 is coupled to the base 121 by metal bonding with a metal provided between the attracting member 123 and the base 121. The attracting member 123 has a substantially disk shape and is made of ceramic. The ceramic forming the attracting member 123 may be one having a volume resistivity of $1 \times 10^{15}$ $\Omega$·cm or more in a temperature range from a room temperature (e.g., 20° C.) to 400° C. As an example of this ceramic, aluminum oxide (alumina) may be used.

The electrostatic chuck 120 includes a plurality of concentric regions RN with respect to the axis line Z, that is, a central axis line of the electrostatic chuck 120. In the present exemplary embodiment, the electrostatic chuck 120 includes a first region R1, a second region R2 and a third region R3. The first region R1 intersects with the axis line Z, and the third region R3 is a region including an edge of the electrostatic chuck 120. The second region R2 is located between the first region R1 and the third region R3. In the present exemplary embodiment, the first region R1 ranges up to a radius of 120 mm from a center of the electrostatic chuck 120; the second region R2 ranges from the radius of 120 mm to a radius of 135 mm of the electrostatic chuck 120; and the third region R3 ranges from the radius of 135 mm to a radius of 150 mm of the electrostatic chuck 120. Further, the number of the regions of the electrostatic chuck 120 may be equal to or larger than 1.

The attracting member 123 of the electrostatic chuck 120 has an attraction electrode 125 embedded therein. The attraction electrode 125 is a film-shaped electrode and is electrically connected with a DC power supply 22 via a switch. If a DC voltage is applied to the attraction electrode 125 from the DC power supply 22, the attracting member 123 generates an electrostatic force such as a Coulomb force and holds the processing target object W with this electrostatic force.

The attracting member 123 is additionally equipped with a multiple number of heaters HN. These heaters HN constitute a part of the temperature control device according to the exemplary embodiment, and are respectively provided in the multiple regions RN of the electrostatic chuck. In the present exemplary embodiment, the multiple heaters HN include a first heater 156, a second heater 157 and a third heater 158. The first heater 156 is provided in the first region R1; the second heater 157, in the second region R2; and the third heater 158, in the third region R3.

The individual heaters HN are connected to a heater power supply 161. In the present exemplary embodiment, a filter 163a is provided between the first heater 156 and the heater power supply 161 to suppress the high frequency power from being introduced into the heater power supply 161. A filter 163b is provided between the second heater 157 and the heater power supply 161 to suppress the high frequency power from being introduced into the heater power supply 161. Further, a filter 163c is provided between the third heater 158 and the heater power supply 161 to suppress the high frequency power from being introduced into the heater power supply 161.

Multiple first elastic members EM1 are provided between the base 121 and the cooling table 117. The first elastic members EM1 are configured to allow the electrostatic chuck 120 to be upwardly spaced apart from the cooling table 117. Each of the first elastic members EM1 is an O-ring. The individual first elastic members EM1 have different diameters and are arranged concentrically with respect to the axis line Z. Further, the first elastic members EM1 are located under boundaries between the adjacent regions of the electrostatic chuck 120 and under the edge of the electrostatic chuck 120. In the present exemplary embodiment, the first elastic members EM1 include an elastic member 165, an elastic member 167 and an elastic member 169. The elastic member 165 is provided under a boundary between the first region R1 and the second region R2; the elastic member 167, under a boundary between the second region R2 and the third region R3; and the elastic member 169, under the edge of the electrostatic chuck 120.

The individual first elastic member EM1 are partially placed in grooves provided on the first top surface 117c of the cooling table 117 and in contact with the first top surface 117c and the bottom surface 121d of the base 121. These first elastic members EM1 define, along with the cooling table 117 and the base 121, a plurality of sealed heat transfer spaces DSN between the first top surface 117c of the cooling table 117 and the bottom surface 121d of the base 121. These heat transfer spaces DSN are respectively extended under the multiple regions RN of the electrostatic chuck 120 and separated from each other. In the exemplary embodiment, the heat transfer spaces DSN include a first heat transfer space DS1, a second heat transfer space DS2 and a third heat transfer space DS3. The first heat transfer space DS1 is located inside the elastic member 165; the second heat transfer space DS2, between the elastic member 165 and the elastic member 167; and the third heat transfer space DS3, between the elastic member 167 and the elastic member 169. As will be described later, a gas source GS of a heat transfer gas (for example, a He gas), a chiller unit TU and a gas exhaust device VU are connected to the heat transfer spaces DSN selectively via a pipeline system PS. Further, a length of each heat transfer space DSN in a vertical direction is set to be in a range from, but not limited to, 0.1 mm to 2.0 mm.

In the present exemplary embodiment, each of the first elastic members EM1 has heat resistivity higher than heat resistivity of each of the heat transfer spaces DSN in which the He gas is supplied. The heat resistivity of each heat transfer space DSN depends on a heat conductivity of the heat transfer gas, a length of the corresponding heat transfer space DSN in the vertical direction and an area thereof. Further, the heat resistivity of each first elastic member EM1 depends on a heat conductivity of the corresponding first elastic member EM1, a thickness of the corresponding first elastic member EM1 in the vertical direction and an area thereof. Thus, a material, the thickness and the area of each of the first elastic members EM1 are determined based on the heat resistivity of the corresponding heat transfer space DSN. Furthermore, the first elastic members EM1 may be required to have low heat conductivity and high heat resistance. Thus, the first elastic members EM1 may be formed of, by way of non-limiting example, perfluoroelastomer.

The stage 116 may be further equipped with a fastening member 171. The fastening member 171 is made of a metal and is configured to clamp the base 121 and the first elastic members EM1 between the fastening member 171 and the cooling table 117. The fastening member 171 is made of a material having low heat conductivity, for example, titanium to suppress heat conduction between the base 121 and the cooling table 117 through the fastening member 171.

In the present exemplary embodiment, the fastening member 171 has a cylindrical portion 171a and an annular portion 171b. The cylindrical portion 171a has a substantially cylindrical shape, and has a first bottom surface 171c at a bottom end thereof. The first bottom surface 171c is a band-shaped surface extended in the circumferential direction thereof.

The annular portion 171b has a substantially annular plate shape and is extended from the cylindrical portion 171a inwardly in the diametric direction to be continuous with an upper inner periphery of the cylindrical portion 171a. This annular portion 171b provides a second bottom surface 171d. The second bottom surface 171d is a band-shaped surface extended in the circumferential direction thereof.

The fastening member 171 is placed such that the first bottom surface 171c is in contact with the second top surface 117e of the cooling table 117 and the second bottom surface 171d is in contact with the second top surface 121e of the base 121. Further, the fastening member 171 is fixed to the peripheral portion 117b of the cooling table 117 by a screw 173. By adjusting screwing of this screw 173 into the fastening member 171, a pressed amount of the first elastic members EM1 is adjusted, so that the length of the heat transfer spaces DSN in the vertical direction is adjusted.

In the exemplary embodiment, a second elastic member 175 is provided between a bottom surface of an inner peripheral portion of the annular portion 171b of the fastening member 171 and the second top surface 121e of the base 121. The second elastic member 175 is implemented by an O-ring and is configured to suppress a particle (e.g., metal powder) that might be generated by a friction between the second bottom surface 171d of the fastening member 171 and the second top surface 121e of the base 121 from being moved toward the attracting member 123.

Furthermore, the second elastic member 175 generates a reaction force smaller than a reaction force generated by the first elastic members EM1. That is, the first elastic members EM1 are configured such that the reaction force generated by the first elastic members EM1 is larger than the reaction force generated by the second elastic member 175. In addition, this second elastic member 175 may be made of a material having high heat resistance and low heat conductivity, for example, perfluoroelastomer.

A heater 176 is provided on the fastening member 171. This heater 176 is extended in the circumferential direction and connected to a heater power supply 161 via a filter 178. The filter 178 is provided to suppress the high frequency power from being introduced into the heater power supply 161.

The heater 176 is provided between a first film 180 and a second film 182. The first film 180 is located closer to the fastening member 171 than the second film 182 is. The first film 180 has heat conductivity lower than that of the second film 182. By way of example, the first film 180 may be a thermally sprayed zirconia-based film, and the second film 182 may be a thermally sprayed yttrium oxide (yttria)-based film. Further, the heater 176 may be a thermally sprayed tungsten film.

A focus ring FR is provided on the second film 182. The focus ring FR may be heated by heat from the heater 176. Further, most of heat flux from the heater 176 flows toward the second film 182 than the first film 180, and flows toward the focus ring FR through the second film 182. Accordingly, the focus ring FR is efficiently heated.

Furthermore, outer side surfaces of the fastening member 171 and the cooling table 117 of the stage 116 and so forth are covered with one or more insulating members 186. The one or more insulating members 186 may be made of, by way of example, but not limitation, aluminium oxide or quartz.

In addition, as illustrated in FIG. 13, a gas line 190 through which the heat transfer gas (e.g., He gas) is supplied into a gap between the processing target object W and the attracting member 123 is provided in the electrostatic chuck 120 and the cooling table 117 of the stage 116. The gas line 190 is connected to a heat transfer gas supply unit 191.

As depicted in FIG. 13, the gas line 190 includes a gas line 190a, a gas line 190b and a gas line 190c. The gas line 190a is formed in the attracting member 123. Further, the gas line 190c is formed in the cooling table 117. The gas line 190a and the gas line 190c are connected to each other with the gas line 190b therebetween. The gas line 190b is implemented by a sleeve 192. This sleeve 192 is a substantially cylindrical member, and at least a surface thereof has insulation property. This surface of the sleeve 192 is made of ceramic. As an example, the sleeve 192 is made of insulating ceramic. By way of example, the sleeve 192 is made of aluminium oxide (alumina). As another example, the sleeve 192 may be implemented by a metal member having a surface on which insulation treatment is performed. For example, the sleeve 192 may have a main body made of aluminium and an alumite film formed on a surface of the main body.

In the base 121 and the cooling table 117, an accommodation space for accommodating the sleeve 192 is formed. A film 194 made of insulating ceramic is formed on a surface 121f of the base 121 which partitions and forms this accommodation space. The film 194 may be, by way of example, but not limitation, a thermally sprayed aluminium oxide (alumina) film.

A third elastic member 196 is provided between the film 194 and the cooling table 117 to hermetically seal the accommodation space of the sleeve 192. The third elastic member 196 is implemented by an O-ring and has insulation property. The third elastic member 196 may be made of, by way of non-limiting example, perfluoroelastomer. Further, a fourth elastic member 198 is provided at an outside of the third elastic member 196. The fourth elastic member 198 is an O-ring and in contact with the first top surface 117c of the cooling table 117 and the bottom surface 121d of the base 121 while sealing the heat transfer space (for example, the first heat transfer space DS1). The fourth elastic member 198 may be made of, by way of example, but not limitation, perfluoroelastomer.

As stated above, in the stage 116, the cooling table 117 and the base 121 are spaced apart from each other by the first elastic members EM1. Further, in this stage 116, no adhesive is used to couple the base 121 and the attracting member 123. Accordingly, the temperature of the electrostatic chuck 120 can be set to be high. Further, since heat transfer between the electrostatic chuck 120 and the cooling table 117 is achieved through the heat transfer gas supplied into the heat transfer spaces DSN, it is also possible to set the temperature of the electrostatic chuck 120 to be low. Furthermore, in this stage 116, a power feed route for the high frequency power to the base 121 of the electrostatic chuck 120 is secured by the power feed body 119, the cooling table 117 and the fastening member 171. Moreover, since the power feed body 119 is not directly connected to the base 121 of the electrostatic chuck 120 but connected to the cooling table 117, aluminium or an aluminium alloy can be used as a material for the power feed body 119. Accordingly, even in case of supplying the high frequency power of the high frequency equal to or higher than 13.56 MHz, a loss of the high frequency power in the power feed body 119 is suppressed.

In addition, as described above, the second elastic member 175 is provided between the bottom surface of the inner peripheral portion of the annular portion 171b of the fastening member 171 and the second top surface 121e of the base 121. Since the second top surface 121e of the peripheral portion 121b of the base 121 and the second bottom surface 171d of the fastening member 171 are in contact with each other, friction is generated at the contact point therebetween, so that the particle (e.g., metal powder) may be generated thereat. Even when this particle is generated, the second elastic member 175 suppresses the particle from adhering to the attracting member 123 and the processing target object W placed on the corresponding attracting member 123.

Further, the first elastic members EM1 are configured such that the reaction force generated by these first elastic members EM1 is larger than the reaction force generated by the second elastic member 175. Accordingly, the electrostatic chuck 120 can be securely spaced from the cooling table 117.

Furthermore, each of the first elastic members EM1 is configured to have the heat resistance higher than the heat resistance of the corresponding heat transfer space DSN when the He gas is supplied in the corresponding heat transfer space DSN. Further, these first elastic members EM1 are made of, by way of example, perfluoroelastomer. With these first elastic members EM1, the heat conduction through the heat transfer spaces DSN is more dominant than heat conduction through the first elastic members EM1 between the electrostatic chuck 120 and the cooling table 117. Thus, the temperature distribution of the electrostatic chuck 120 can be uniformed.

Additionally, the gas line 190 for the heat transfer gas supplied into the gap between the processing target object W and the attracting member 123 is formed without using any adhesive. Further, the surface 121f of the base 121, which forms the accommodation space in which the sleeve 192 as a part of the gas line 190 is placed, is covered with the film 194, and the third elastic member 196 having the insulation property is provided between the film 194 and the cooling table 117 to seal the corresponding accommodation space. With this configuration, introduction of the plasma into the gap between the base 121 and the cooling table 117 and a resultant dielectric breakdown of the base 121 can be suppressed.

Furthermore, according to the plasma processing apparatus 100 having the above-described stage 116, a plasma processing can be performed on the processing target object W in a wide temperature range from a low temperature to a high temperature.

Figure 14:
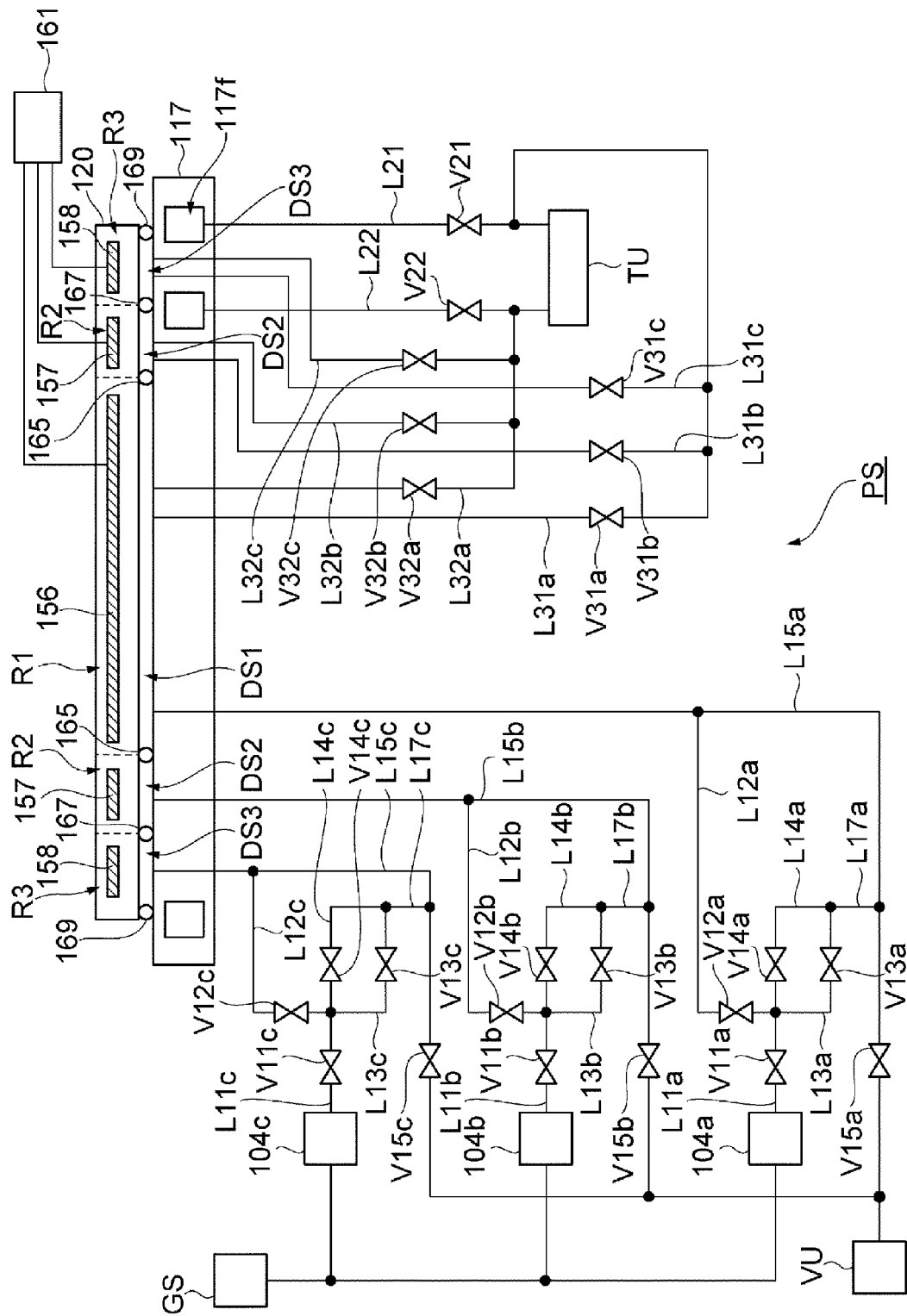
FIG. 14 is a diagram illustrating a configuration of an example of a pipeline system.

Now, a pipeline system PS that can be adopted in the plasma processing apparatus 100 will be explained. FIG. 14 is a diagram illustrating an example configuration of the pipeline system. The pipeline system PS shown in FIG. 14 constitutes a part of the temperature control device according to the exemplary embodiment, and has a multiple number of valves. The pipeline system PS is configured to connect the gas source GS, the chiller unit TU and the gas exhaust device VU selectively to each of the heat transfer spaces DSN and configured to switch a connection and a disconnection between the chiller unit TU and the path 117f. Below, the description will be provided for the example where the heat transfer spaces DSN include three heat transfer spaces (the first heat transfer space DS1, the second heat transfer space DS2, and the third heat transfer space DS3). Here, however, it should be noted that the number of the heat transfer spaces DSN may not be particularly limited, and may be one or more as long as the number of the heat transfer spaces DSN corresponds to the number of the regions RN of the electrostatic chuck 120.

The pipeline system PS includes a line L21, a line L22, a valve V21 and a valve V22. One end of the line L21 is connected to the chiller unit TU, and the other end of the line L21 is connected to the path 117f. The valve V21 is provided at a part of the line L21. One end of the line L22 is connected to the chiller unit TU, and the other end of the line L22 is connected to the path 117f. The valve V22 is provided at a part of the line L22. If the valve V21 and the valve V22 are opened, the coolant is supplied from the chiller unit TU into the path 117f through the line L21. The coolant supplied into the path 117f is returned back into the chiller unit TU through the line L22.

Further, the pipeline system PS further includes a pressure controller 104a, a line Lila, a line L12a, a line L13a, a line L14a, a line L15a, a line L17a, a line L31a, a line L32a, a valve V11a, a valve V12a, a valve V13a, a vale V14a, a valve V15a, a valve V31a and a valve V32a.

The pressure controller 104a is connected to the gas source GS. One end of the line Lila is connected to the pressure controller 104a. The valve Vila is provided at a part of the line Lila. One end of the line L15a is connected to the first heat transfer space DS1, and the other end of the line L15a is connected to the gas exhaust device VU. The valve V15a is provided at a part of the line L15a.

One end of the line L12a is connected to the other end of the line Lila. The other end of the line L12a is connected to a part of the line L15a on the side of the first heat transfer space DS1 with respect to the valve V15a. The valve V12a is provided at a part of the line L12a. One end of the line L13a and one end of the line L14a are also connected to the other end of the line Lila. The valve V13a is provided at a part of the line L13a, and the valve V14a is provided at a part of the line L14a. The other end of the line L13a and the other end of the line L14a are connected to each other. One end of the line L17a is connected to a connection point between the other end of the line L13a and the other end of the line L14a. The other end of the line L17a is connected to a part of the line L15a closer to the valve V15a than the other end of the line L12a is close to the valve V15a.

One end of the line L31a is connected to a part of the line L21 on the side of the chiller unit TU with respect to the valve V21. The other end of the line L31a is connected to the first heat transfer space DS1. The valve V31a is provided at a part of the line L31a. One end of the line L32a is connected to a part of the line L22 on the side of the chiller unit TU with respect to the valve V22. The other end of the line L32a is connected to the first heat transfer space DS1. The valve V32a is provided at a part of the line L32a.

Further, the pipeline system PS additionally includes a pressure controller 104b, a line L11b, a line L12b, a line L13b, a line L14b, a line L15b, a line L17b, a line L31b, a line L32b, a valve V11b, a valve V12b, a valve V13b, a valve V14b, a valve V15b, a valve V31b and a valve V32b.

The pressure controller 104b is connected to the gas source GS. One end of the line L11b is connected to the pressure controller 104b. The valve V11b is provided at a part of the line L11b. One end of the line L15b is connected to the second heat transfer space DS2, and the other end of the line L15b is connected to the gas exhaust device VU. Further, the valve V15b is provided at a part of the line L15b.

One end of the line L12b is connected to the other end of the line L11b. The other end of the line L12b is connected to a part of the line L15b on the side of the second heat transfer space DS2 with respect to the valve V15b. The valve V12b is provided at a part of the line L12b. One end of the line L13b and one end of the line L14b are also connected to the other end of the line L11b. The valve V13b is provided at a part of the line L13b, and the valve V14b is provided at a part of the line L14b. The other end of the line L13b and the other end of the line L14b are connected to each other. One end of the line L17b is connected to a connection point between the other end of the line L13b and the other end of the line L14b. The other end of the line L17b is connected to a part of the line L15b closer to the valve V15b than the other end of the line L12b is close to the valve V15b.

One end of the line L31b is connected to a part of the line L21 on the side of the chiller unit TU with respect to the valve V21. The other end of the line L31b is connected to the second heat transfer space DS2. The valve V31b is provided at a part of the line L31b. One end of the line L32b is connected to a part of the line L22 on the side of the chiller unit TU with respect to the valve V22. The other end of the line L32b is connected to the second heat transfer space DS2. The valve V32b is provided at a part of the line L32b.

Further, the pipeline system PS further includes a pressure controller 104c, a line L11c, a line L12c, a line L13c, a line L14c, a line L15c, a line L17c, a line L31c, a line L32c, a valve V11c, a valve V12c, a valve V13c, a valve V14c, a valve V15c, a valve V31c and a valve V32c.

The pressure controller 104c is connected to the gas source GS. One end of the line L11c is connected to the pressure controller 104c. The valve V11c is provided at a part of the line L11c. One end of the line L15c is connected to the third heat transfer space DS3, and the other end of the line L15c is connected to the gas exhaust device VU. Further, the valve V15c is provided at a part of the line L15c.

One end of the line L12c is connected to the other end of the line L11c. The other end of the line L12c is connected to a part of the line L15c on the side of the third heat transfer space DS3 with respect to the valve V15c. The valve V12c is provided at a part of the line L12c. One end of the line L13c and one end of the line L14c are also connected to the other end of the line L11c. The valve V13c is provided at a part of the line L13c, and the valve V14c is provided at a part of the line L14c. The other end of the line L13c and the other end of the line L14c are connected to each other. One end of the line L17c is connected to a connection point between the other end of the line L13c and the other end of the line L14c. The other end of the line L17c is connected to a part of the line L15c closer to the valve V15c than the other end of the line L12c is close to the valve V15c.

One end of the line L31c is connected to a part of the line L21 on the side of the chiller unit TU with respect to the valve V21. The other end of the line L31c is connected to the third heat transfer space DS3. The valve V31c is provided at a part of the line L31c. One end of the line L32c is connected to a part of the line L22 on the side of the chiller unit TU with respect to the valve V22. The other end of the line L32c is connected to the third heat transfer space DS3. The valve V32c is provided at a part of the line L32c.

In the pipeline system PS, when the valve V21 and the valve V22 are opened, the coolant is circulated between the chiller unit TU and the path 117f. Meanwhile, when the valve V21 and the valve V22 are closed, the coolant is not supplied into the path 117f from the chiller unit TU.

Further, when the valve V31a, the valve V32a, the valve V31b, the valve V32b, the valve V31c and the valve V32c are opened, the coolant is circulated between the chiller unit TU and the heat transfer spaces DSN (DS1, DS2 and DS3). Furthermore, when the coolant is supplied into the heat transfer spaces DSN (DS1, DS2 and DS3), the valve V11a, the valve V12a, the valve V13a, the valve V14a, the valve V15*a*, the valve V11*b*, the valve V12*b*, the valve V13*b*, the valve V14*b*, the valve V15*b*, the valve V11*c*, the valve V12*c*, the valve V13*c*, the valve V14*c* and the valve V15*c* are closed. Meanwhile, when the valve V31*a*, the valve V32*a*, the valve V31*b*, the valve V32*b*, the valve V31*c* and the valve V32*c* are closed, the coolant is not supplied into the heat transfer spaces DSN (DS1, DS2 and DS3) from the chiller unit TU.

Moreover, when the valve V11*a*, the valve V12*a*, the valve V11*b*, the valve V12*b*, the valve V11*c* and the valve V12*c* are opened while the valve V13*a*, the valve V14*a*, the valve V15*a*, the valve V13*b*, the valve V14*b*, the valve V15*b*, the valve V13*c*, the valve V14*c* and the valve V15*c* are closed, the heat transfer gas is supplied into the heat transfer spaces DSN (DS1, DS2 and DS3) from the gas source GS.

Furthermore, when the valve V15*a*, the valve V15*b* and the valve V15*c* are opened while the valve V11*a*, the valve V12*a*, the valve V13*a*, the valve V14*a*, the valve V11*b*, the valve V12*b*, the valve V13*b*, the valve V14*b*, the valve V11*c*, the valve V12*c*, the valve V13*c* and the valve V14*c* are closed, the heat transfer spaces DSN (DS1, DS2 and DS3) are decompressed by the gas exhaust device VU.

Now, the method MT will be discussed for an example case where the method MT is applied to the processing target object W shown in FIG. 2 by using the plasma processing apparatus 100.

In the process ST1, the temperature of the electrostatic chuck 120 is set to be equal to or lower than −30° C. for main etching to be described later. In the process ST1, the coolant is circulated between the chiller unit TU and the path 117*f*, and, also, between the heat transfer spaces DSN and the chiller unit TU. To elaborate, the valve V21, the valve V22, the valve V31*a*, the valve V32*a*, the valve V31*b*, the valve V32*b*, the valve V31*c* and the valve V32*c* are opened, while the other valves of the pipeline system PS are closed. In the process ST1, the multiple heaters HN are set to be off. That is, in the process ST1, no power is supplied to the heaters HN from the heater power supply 161.

In the process ST2, the processing target object W is carried into the chamber 112*c*. In the process ST2, the processing target object W is placed on and held by the electrostatic chuck 120.

In the process ST3, the processing gas is supplied into the chamber 112*c* from the gas source group 40. Further, the pressure of the chamber 112*c* is set to be a preset pressure by the gas exhaust device 150. In addition, the first high frequency power is output from the first high frequency power supply 62 for plasma generation. Accordingly, the plasma of the processing gas is generated within the chamber 112*c*. Further, when necessary, the second high frequency power may be supplied to the lower electrode of the stage 116 from the second high frequency power supply 64. In the process ST3, the etching target film EF is etched by ions and/or radicals in this plasma.

In the main etching ST31, the etching target film EF is etched by the ions and/or radicals in the plasma of the processing gas in the state that the temperature of the electrostatic chuck 120 is set to be equal to or lower than −30° C. Opening/closing states of the multiple valves of the pipeline system PS when the main etching ST31 is being performed may be the same as the opening/closing states of the valves of the pipeline system PS in the process ST1.

The temperature of the electrostatic chuck 120 when the overetching ST32 is being performed may be set to be, for example, higher than −30° C. and lower than 0° C. However, the temperature of the electrostatic chuck 120 during the overetching ST32 may not be limited to the temperature higher than −30° C. and lower than 0° C.

In the process ST4, the neutralization of the electrostatic chuck 120 is performed. In the neutralization of the electrostatic chuck 120, a voltage having an opposite polarity to the voltage applied to the attraction electrode 125 of the electrostatic chuck 120 when the electrostatic chuck 120 is holding the processing target object W is applied to the attraction electrode 125 of the electrostatic chuck 120.

In the process ST5, the temperature of the electrostatic chuck 120 is raised to be equal to or higher than 0° C. In the process ST5, the valve V21, the valve V22, the valve V15*a*, the valve V15*b* and the valve V15*c* are opened, and the other valves of the pipeline system PS are closed. Further, the power is supplied from the heater power supply 161 to the multiple heaters HN such that the corresponding heaters HN generate heat. In the process ST5, the heat transfer spaces DSN are decompressed by the gas exhaust device VU. As a result, the heat transfer between the electrostatic chuck 120 and the cooling table 117 is suppressed. Further, in the process ST5, the heaters HN generate heat. Thus, a time period required to raise the temperature of the electrostatic chuck 120 is shortened in the process ST5.

In the process ST6, the processing target object W is carried out of the chamber 112*c*. During the process ST6, the temperature of the electrostatic chuck 120 is maintained to be equal to or higher than 0° C. Further, while maintaining the temperature of the electrostatic chuck 120 to be equal to or higher than 0° C. after the process ST5 is performed, the opening/closing states of the multiple valves of the pipeline system PS may be the same as the opening/closing states of the valves of the pipeline system PS in the process ST5. Alternatively, the power is applied to the heaters HN from the heater power supply 161 such that the corresponding heaters HN generate heat, and the coolant is supplied from the chiller unit TU into at least either of the heat transfer spaces DSN (DS1, DS2 and DS3) and the path 117*f*. The coolant may be supplied into the path 117*f* from the chiller unit TU, and the heat transfer gas may be supplied into the heat transfer spaces DSN (DS1, DS2 and DS3) from the gas source GS.

In the process ST71, the dummy wafer is carried into the chamber 112*c* and is held by the electrostatic chuck 120. In the process ST72, the plasma of the cleaning gas is generated within the chamber 112*c*. In the process ST72, the cleaning gas is supplied into the chamber 112*c* from the gas source group 40. Further, the first high frequency power is supplied from the first high frequency power supply 62 for plasma generation. In the process ST73, the neutralization of the electrostatic chuck 120 is performed. In the process ST74, the dummy wafer is carried out of the chamber 112*c*. In the process ST75, the plasma of the cleaning gas is generated within the chamber 112*c* in the state that an object such as the dummy wafer is not placed on the electrostatic chuck 120. In the method MT, the temperature of the electrostatic chuck 120 is maintained to be equal to or higher than 0° C. until a certain time within a processing time of the process ST75 after the process ST5 is performed. Accordingly, the time period for the cleaning of the process ST7 is shortened.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A plasma processing apparatus, comprising:
   a chamber;
   a stage, provided in the chamber, on which a target object including an etching film is placed;
   a temperature adjusting device configured to adjust a temperature of the stage;
   a processing gas supply device configured to supply a processing gas containing a fluorocarbon gas and/or a hydrofluorocarbon gas into the chamber;
   a cleaning gas supply device configured to supply a cleaning gas containing an oxygen gas into the chamber;
   a plasma generator device configured to generate a plasma in the chamber; and
   a controller,
   wherein the controller is configured to perform:
   (a) placing the target object on the stage,
   (b) etching the etching film, comprising:
      (b1) supplying the processing gas into the chamber from the processing gas supply device,
      (b2) generating a plasma from the processing gas in the chamber,
      (b3) maintaining the temperature of the stage to be equal to or lower than −30° C. by the temperature adjusting device during (b1) and (b2), and
      (b4) an overetching of additionally etching the etching film after (1) and (b2),
   (c) after (b), removing the target object from the chamber, and
   (d) after (c), cleaning an inside of the chamber, which comprises:
      (d1) supplying the cleaning gas into the chamber from the cleaning gas supply device;
      (d2) generating a plasma from the cleaning gas in the chamber; and
      (d3) maintaining the temperature of the stage to be equal to or higher than 0° C. by the temperature adjusting device during (d1) and (d2),
   wherein the controller is configured to perform:
   prior to (d), raising a temperature of the stage by the temperature adjusting device while the overetching is being performed during (b4), in order to raise the temperature of the stage to be equal to or higher than 0° C.

2. The plasma processing apparatus of claim 1, wherein the stage comprises an electrostatic chuck configured to hold the target object placed thereon, and the controller is configured to perform:
   after (b) and before (c), neutralizing the electrostatic chuck; and
   prior to (d), raising a temperature of the stage by the temperature adjusting device while the neutralizing of the stage is being performed, in order to raise the temperature of the stage to be equal to or higher than 0° C.

3. The plasma processing apparatus of claim 2, wherein the stage comprises a lower electrode in which a path is formed,
   the electrostatic chuck is provided on the lower electrode,
   the temperature adjusting device comprises:
      a first temperature adjuster configured to supply a first heat exchange medium; and
      a second temperature adjuster configured to supply a second heat exchange medium having a temperature higher than a temperature of the first heat exchange medium, and
   the controller is configured to perform:
      supplying the first heat exchange medium into the path from the first temperature adjuster while the main etching is being performed, and
      supplying the second heat exchange medium into the path from the second temperature adjuster while the raising of the temperature of the stage is being performed.

4. The plasma processing apparatus of claim 2, wherein the stage comprises a cooling table in which a path is formed,
   the electrostatic chuck is provided on the cooling table,
   a sealed space is provided between the electrostatic chuck and the cooling table,
   the temperature adjusting device comprises:
      a heater provided in the electrostatic chuck;
      a chiller unit configured to supply a coolant into the path; and
      a pipeline system configured to connect one of the chiller unit, a gas exhaust device and a source of a heat transfer gas to the sealed space selectively, and
   the controller is configured to perform:
      supplying the coolant into the path from the chiller unit and supplying the coolant into the sealed space from the chiller unit when the main etching is being performed; and
      heating the electrostatic chuck by the heater and decompressing the sealed space by the gas exhaust device while the raising of the temperature of the stage is being performed.

5. The plasma processing apparatus of claim 1, wherein in (d), the plasma from the cleaning gas is generated after a dummy wafer is carried into the chamber.

6. The plasma processing apparatus of claim 1, wherein in (d),
   the plasma from the cleaning gas is generated after a dummy wafer is carried into the chamber,
   the dummy wafer is carried out from the chamber, and
   the plasma from the cleaning gas is generated after the dummy wafer is carried out from the chamber.

7. The plasma processing apparatus of claim 1, wherein the stage comprises an electrostatic chuck configured to hold the target object placed thereon and a lower electrode in which a path is formed,
   the electrostatic chuck is provided on the lower electrode,
   the temperature adjusting device comprises:
      a first temperature adjuster configured to supply a first heat exchange medium; and a second temperature adjuster configured to supply a second heat exchange medium having a temperature higher than a temperature of the first heat exchange medium, and the controller is configured to perform:

supplying the first heat exchange medium into the path from the first temperature adjuster while the main etching is being performed, and supplying the second heat exchange medium into the path from the second temperature adjuster while the raising of the temperature of the stage is being performed.

8. The plasma processing apparatus of claim 7, wherein the electrostatic chuck is provided on the lower electrode via a first annular elastic member.

9. The plasma processing apparatus of claim 8, wherein each of the electrostatic chuck and the lower electrode has an annular peripheral portion having a step-shaped portion, and a fastening member, arranged to fit on each of a top surface of the annular peripheral portion of the electrostatic chuck and the lower electrode, is fixed to the lower electrode with a screw.

10. The plasma processing apparatus of claim 9, further comprising:

a second annular elastic member provided between the electrostatic chuck and the fastening member.

11. The plasma processing apparatus of claim 10, wherein the second annular elastic member generates a reaction force smaller than a reaction force generated by the first annular elastic member.

12. The plasma processing apparatus of claim 1, wherein the stage comprises an electrostatic chuck configured to hold the target object placed thereon and a cooling table in which a path is formed, the electrostatic chuck is provided on the cooling table, a sealed space is provided between the electrostatic chuck and the cooling table, the temperature adjusting device comprises:

a heater provided in the electrostatic chuck;

a chiller unit configured to supply a coolant into the path; and a pipeline system configured to connect one of the chiller unit, a gas exhaust device and a source of a heat transfer gas to the sealed space selectively, and the controller is configured to perform:

supplying the coolant into the path from the chiller unit and supplying the coolant into the sealed space from the chiller unit when the main etching is being performed; and heating the electrostatic chuck by the heater and decompressing the sealed space by the gas exhaust device while the raising of the temperature of the stage is being performed.

13. The plasma processing apparatus of claim 12, wherein the electrostatic chuck is provided on the cooling table via a first elastic member which is annular.

14. The plasma processing apparatus of claim 13, wherein each of the electrostatic chuck and the cooling table has an annular peripheral portion having a step-shaped portion, and a fastening member, arranged to fit on each of a top surface of the annular peripheral portion of the electrostatic chuck and the cooling table, is fixed to the cooling table with a screw.

15. The plasma processing apparatus of claim 14, further comprising:

a second annular elastic member provided between the electrostatic chuck and the fastening member.

16. The plasma processing apparatus of claim 15, wherein the second elastic member generates a reaction force smaller than a reaction force generated by the first elastic member.

17. The plasma processing apparatus of claim 1, wherein the stage comprises an electrostatic chuck configured to hold the target object placed thereon.

18. A plasma processing apparatus, comprising:

a chamber;

a stage, provided in the chamber, on which a target object including an etching film is placed;

a temperature adjusting device configured to adjust a temperature of the stage;

a processing gas supply device configured to supply a processing gas containing a fluorocarbon gas and/or a hydrofluorocarbon gas into the chamber;

a cleaning gas supply device configured to supply a cleaning gas containing an oxygen gas into the chamber;

a plasma generator device configured to generate a plasma in the chamber; and a controller, wherein the controller is configured to perform:

(a) placing the target object on the stage, (b) etching the etching film, comprising:

(b1) supplying the processing gas into the chamber from the processing gas supply device, (b2) generating a plasma from the processing gas in the chamber, (b3) maintaining the temperature of the stage to be equal to or lower than −30° C. by the temperature adjusting device during (b1) and (b2), and (b4) an overetching of additionally etching the etching film after (b1) and (b2), (c) after (b), removing the target object from the chamber, and (d) after (c), cleaning an inside of the chamber, which comprises:

(d1) supplying the cleaning gas into the chamber from the cleaning gas supply device;

(d2) generating a plasma from the cleaning gas in the chamber; and (d3) maintaining the temperature of the stage to be equal to or higher than 0° C. by the temperature adjusting device during (d1) and (d2), wherein the controller is configured to perform:

setting a temperature of the stage to be higher than −30° C. and lower than 0° C. while the overetching is being performed during (b4).

* * * * *